(12) United States Patent
Tzuang Yang et al.

(10) Patent No.: US 9,978,699 B1
(45) Date of Patent: May 22, 2018

(54) THREE-DIMENSIONAL COMPLEMENTARY-CONDUCTING-STRIP STRUCTURE

(71) Applicant: DR Technology Consulting Company, LTD., Hsinchu County (TW)

(72) Inventors: Gin-Lan Tzuang Yang, Hsinchu County (TW); Lawrence Dah-Ching Tzuang, Goleta, CA (US)

(73) Assignee: DR TECHNOLOGY CONSULTING COMPANY, LTD., Hsinchu County (TW)

( * ) Notice: Subject to any disclaimer, the term of this patent is extended or adjusted under 35 U.S.C. 154(b) by 0 days. days.

(21) Appl. No.: 15/481,872

(22) Filed: Apr. 7, 2017

(51) Int. Cl.
| | |
|---|---|
| *H01L 23/58* | (2006.01) |
| *H01L 23/66* | (2006.01) |
| *H01L 23/528* | (2006.01) |
| *H01L 23/522* | (2006.01) |
| *H01P 3/08* | (2006.01) |

(52) U.S. Cl.
CPC ............ *H01L 23/66* (2013.01); *H01L 23/528* (2013.01); *H01L 23/5226* (2013.01); *H01P 3/08* (2013.01); *H01L 2223/6616* (2013.01); *H01L 2223/6683* (2013.01)

(58) Field of Classification Search
CPC ... H01L 23/66; H01L 23/5226; H01L 23/528; H01L 2223/6616; H01L 2223/6683; H01P 3/08
USPC ........................................................ 257/664
See application file for complete search history.

(56) References Cited

U.S. PATENT DOCUMENTS

| | | | |
|---|---|---|---|
| 8,085,113 B2 | 12/2011 | Tzuang et al. | |
| 8,106,721 B2 | 1/2012 | Tzuang et al. | |
| 8,106,729 B2 | 1/2012 | Tzuang et al. | |
| 8,183,961 B2 | 5/2012 | Tzuang et al. | |

*Primary Examiner* — Tu-Tu Ho
(74) *Attorney, Agent, or Firm* — WPAT, PC

(57) ABSTRACT

The invention discloses a three-dimensional complementary-conducting-strip (CCS) structure. Some two-dimensional mesh metal layers are stacked vertically and connected mutually via numerous vias to form a three-dimensional network structure, and one or more signal lines with three-dimensional trace style(s) are positioned inside and separated away the three-dimensional network structure. Moreover, each two-dimensional mesh metal layer is a planar metal layer with one or more empty areas. The three-dimensional network structure is grounded, the signal lines(s) is electrically connected to the device(s) and/or terminal(s) respectively, and the dielectric material(s) is used to electrically insulate the signal line(s) from the three-dimensional network structure.

18 Claims, 26 Drawing Sheets

THREE-DIMENSIONAL COMPLEMENTARY-CONDUCTING-STRIP STRUCTURE

FIELD OF THE INVENTION

The present invention relates to the complementary-conducting-strip structure, especially related to the three-dimensional complementary-conducting-strip structure that one or more signal lines may trace three-dimensionally inside and that may be applied to the microwave/millmeter wave integrated circuits and the coupled lines between high frequency modules.

BACKGROUND OF THE INVENTION

The development of the semiconductor industry has continuously increased requirements of the high density integrated circuits during the past years due to their smaller area, higher operation frequency and other benefits. No matter the central processing unit (CPU), the graphic processing unit (GPU), the integrated circuits applied on the wireless products such as microwave/millmeter communication or ultrahigh frequency (UHV) communication, or other integrated circuits.

Besides the approach of directly shrinking the critical dimension (CD), such as the finFET and the carbon nanotube developed recently, another approach is to transmit signs between numerous elements and/or terminals by using the multilayered integration technology. For example, both the thin-film mirostrips (TFMSs) and the complementary-conducting-strip (CCS) are the technologies used to form the signal lines for the monolithic microwave integrated circuit (MMIC) or other applications. Nevertheless, all currently available technologies still has to be improved for saving the wafer area, reducing interference, enhancing heat dissipation, increasing design flexibility, and so on.

Accordingly, it is desired to improve the current technologies or develop new technologies for further develop and achieve high density integrated circuits, especially when the commercial applications required integrated circuits with more density and more efficiency.

SUMMARY OF THE INVENTION

The proposed invention presents the three-dimensional complementary-conducting-strip structure that may be applied to at least form the transmission line and the coupled line. In the proposed invention, two or more two-dimensional mesh metal layers are vertically stacked and connected mutually through numerous vias (may be viewed as two-dimensional mesh vias) to form a three-dimensional network structure, also one or more signal lines trace three-dimensionally inside the three-dimensional network structure. Moreover, each signal line is formed by one or more horizontal metal lines and one or more vias (may be viewed as signal line vias) used to connect these horizontal metal lines.

The proposed invention presents the three-dimensional complementary-conducting-strip structure that may be used to form the transmission line, the coupled line and so on. In the proposed invention, one or more signal lines trace three-dimensionally inside numerous unit cells arranged three-dimensionally, wherein the trace style of each signal line is arbitrarily (such as meander signal line). Inside each unit cell, each signal line is separated from both all edges of the unit cell and other signal lines.

The proposed invention presents three-dimensional complementary-conducting-strip structure that are formed on the substrate. The proposed structure may be viewed as the combination of numerous two-dimensional mesh metal layers and numerous two-dimensional which alternatively stacked vertical to the substrate, and plus numerous two-dimensional mesh vias connecting these two-dimensional mesh metal layers and numerous signal line vias connecting these signal line metal layers. Each two-dimensional mesh metal layer is a planar metal layer with one or more empty areas, and each signal line is formed by one or more metal lines (especially one or more metal lines parallel to the substrate surface and/or these two-dimensional mesh metal layers) positioned the same plane (or viewed as positioned between two adjacent two-dimensional mesh metal layers). Further, the signal lines pass through these empty surfaces along the direction vertical to the surface of the substrate, and pass through these gaps between these two-dimensional mesh vias along the direction parallel to the surface of the substrate. Whether the two-dimensional mesh metal layers or the signal line metal layer directly contact with the substrate (or viewed positioned on the most down layer of these metal layers) is not limited. Moreover, numerous dielectric layers (or viewed as inter-metal dielectric layer) may be positioned between adjacent metal layers (or viewed as may be integrated with these metal layer as same layer) so as to provide the required electric isolation and mechanical support. In additional, the dielectric layers at least surrounds these signal line and the edge of these unit cells, and usually fills in the space between these signal lines and the edges of these unit cells.

In general, how these signal lines is traced and distributed needs not to be limited, the only requirements are that different signal lines do not contact with each other and each signal line may be separated away both these two-dimensional mesh metal layers and these two-dimensional vias used to connect these two-dimensional mesh layers. For example, inside each unit cell, these signal lines have one or more of the following trace styles: single line along the horizontal direction, meander line along the horizontal direction, single line along the vertical direction, meander line along the vertical direction, two parallel segments along the horizontal direction, two parallel segments along the vertical direction, coupled lines structure along the horizontal direction, coupled lines structure along the vertical direction, two signal lines shuttle alongside along the horizontal direction, two signal lines shuttle alongside along the vertical direction, and three or more signal lines pass through respectively. Besides, inside any unit cell, the shape of these signal lines comprises at least one of the following: straight line shape, L-like shape, T-like shape, cross shape, five straight lines connected to each other, and six straight lines connected to each other.

The three-dimensional complementary-conducting-strip structure proposed by this invention has at least the following advantages when compare with the conventional two-dimensional complementary-conducting-strip structure. First, more design flexibility because the vertical portions of the three-dimensional complementary-conducting-strip structure provide some adjustment flexibility that the conventional two-dimensional complementary-conducting-strip structure can not provide. Second, better screen effect because each signal line is screened by the grounded three-dimensional network structure along all of the three-dimensional directions, no matter horizontal or vertical. Third, better heat dissipation because each signal line is close to the metal used to form the three-dimensional network structure along all of the horizontal and vertical directions (no matter the two-dimensional mesh metal layers along the horizontal direction or the signal line vias along the vertical direction). Further, less occupied integrated circuits area because these signal lines may trace three-dimensionally and then the integrated circuits area occupied by the signal lines used to connect numerous elements/terminals may be less than that occupied by the conventional two-dimensional complementary-conducting-strip structure used to connect the same amount of connected elements/terminals. Besides, more adjustable parameters and larger adjustable range is benefit to adjust in comply with the factory fabrication to increase both the characteristic impedance (Zc) and qualify factor (Q-value) and also to minimize the effect on the slow wave factor (SWF).

DETAILED DESCRIPTION OF THE INVENTION

Reference will now be made in details to specific embodiment of the present invention. Examples of these embodiments are illustrated in the accompanying drawings. While the invention will be described in conjunction with these specific embodiments, it will be understood that the intent is not to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without at least one of these specific details. In other instances, the well-known portions are less or not described in detail in order not to obscure the present invention.

The invention is related to the three-dimensional complementary-conducting-strip structure, and is related to the improvement of the conventional complementary-conducting-strip structure. Hence, the details of the conventional complementary-conducting-strip structure are omitted herein, but only the differences between the proposed three-dimensional complementary-conducting-strip structure and the conventional two-dimensional complementary-conducting-strip structure, also the corresponding advantages, are particularly emphasized. Regarding the details of the conventional two-dimensional complementary-conducting-strip structure, no matter is applied on the transmission line, the coupled line or others, no matter numerous signal lines and numerous two-dimensional mesh metal layers are alternatively stacked or numerous signal lines are posited on numerous stacked two-dimensional mesh metal layers, even other related details, these details may be understood by referring at least to the following document: U.S. Pat. No. 8,183,961, U.S. Pat. No. 8,106,729, U.S. Pat. No. 8,106,721 and U.S. Pat. No. 8,085,113.

Figure 1A:
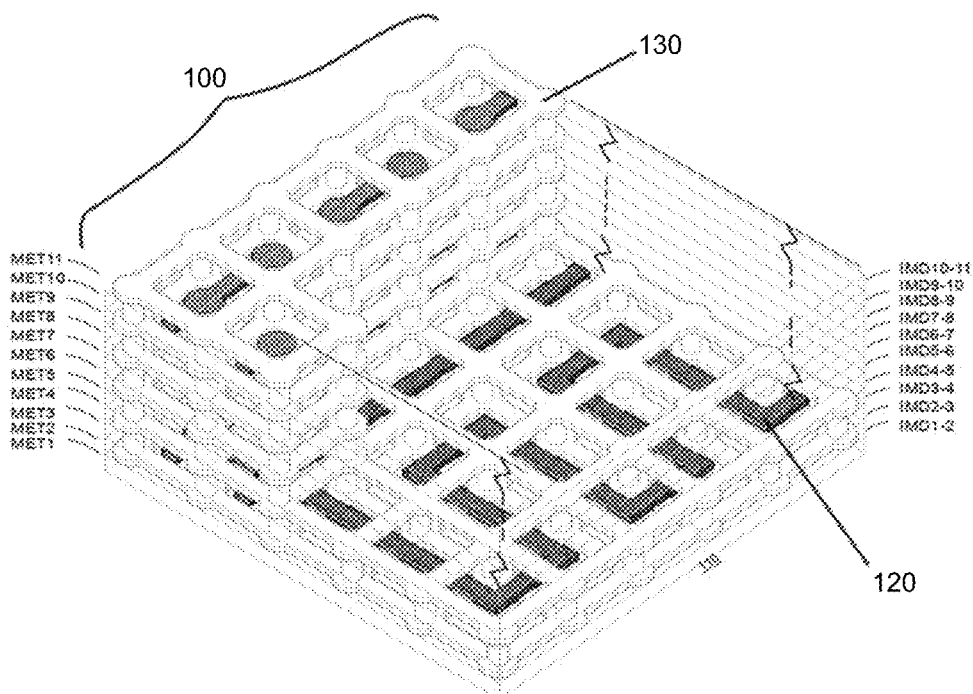
FIG. 1A、FIG. 1B、FIG. 1C and FIG. 1D briefly illustrates the oblique view, the bottom view and two different side views of one exemplary embodiment that uses the proposed three-dimensional complementary-conducting-strip structure to form the transmission line respectively.
Figure 1B:
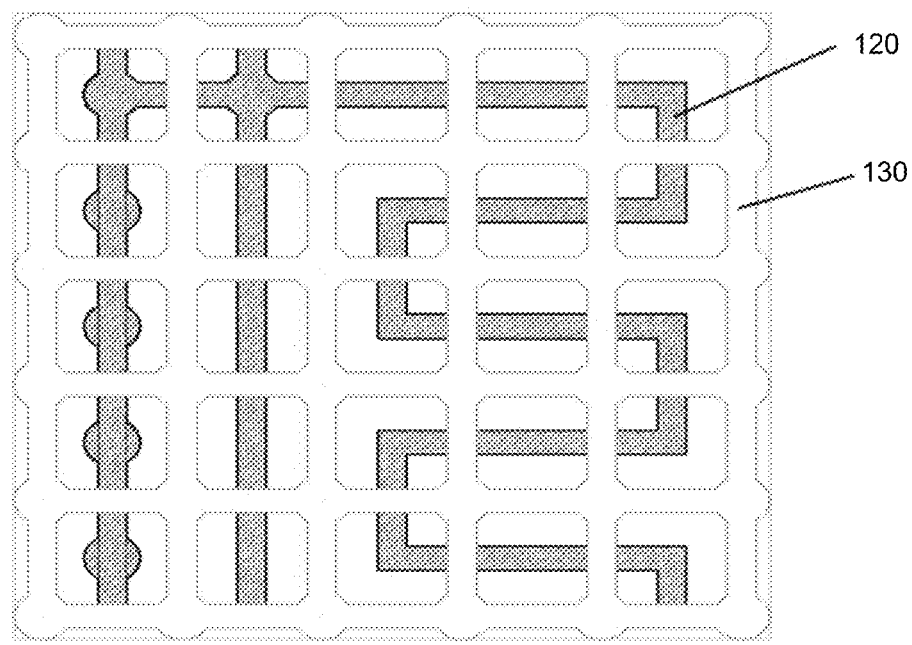
Figure 1C:
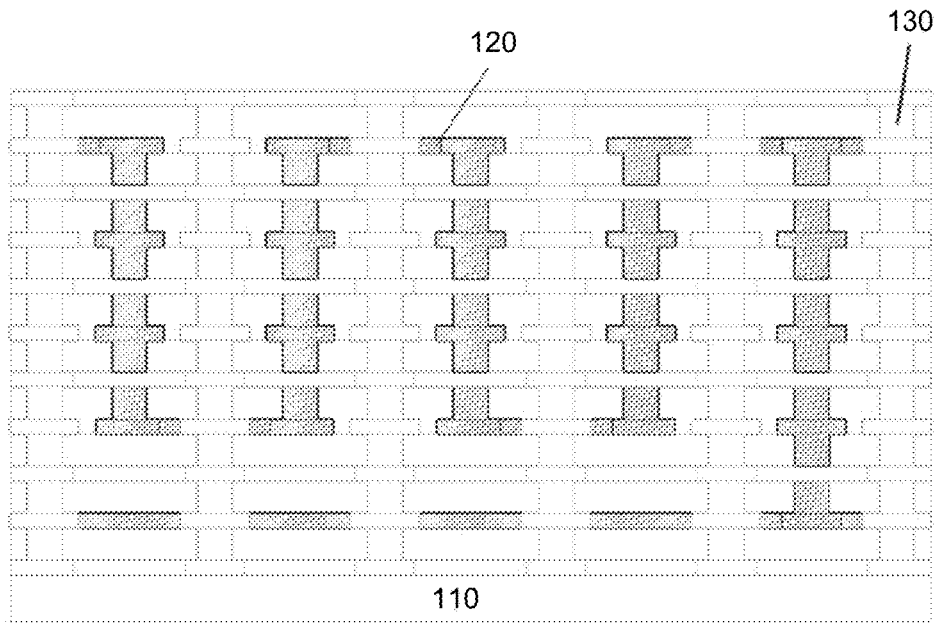
Figure 1D:
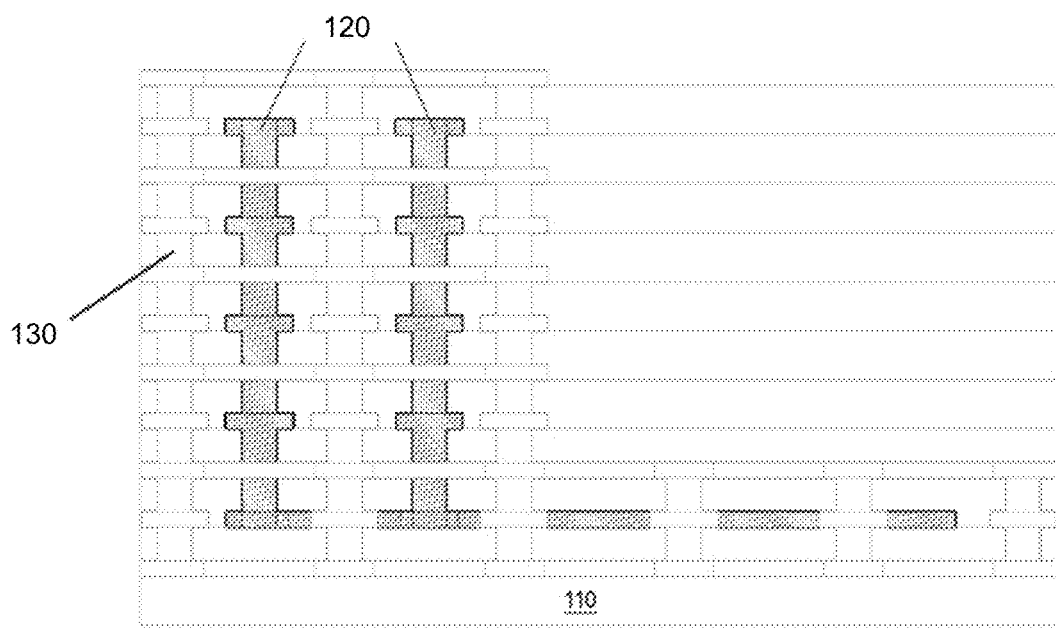
Figure 2A:
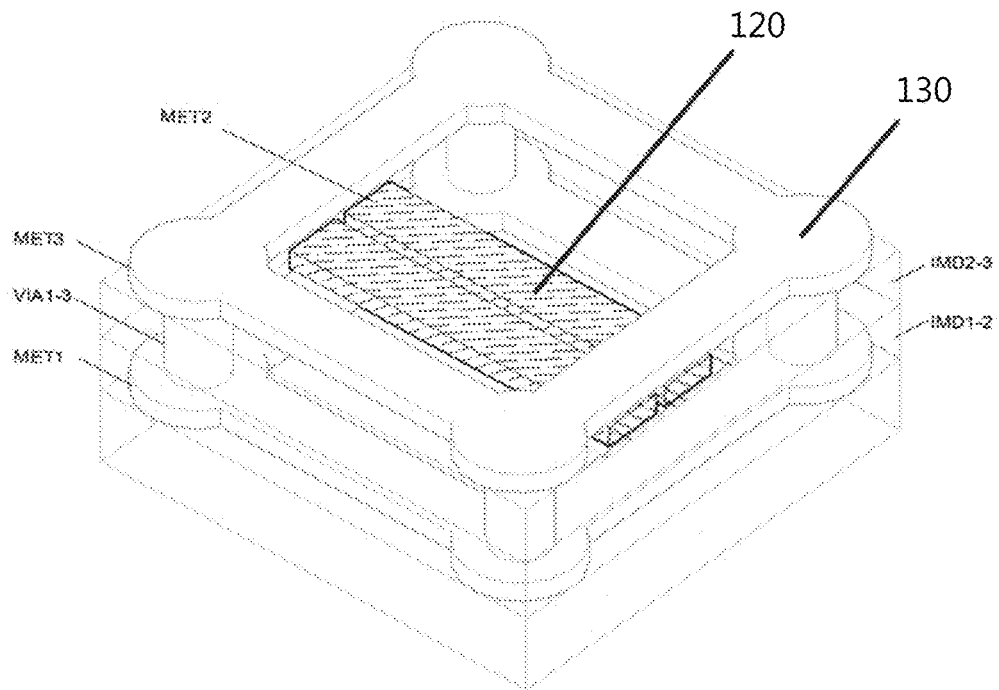
FIG. 2A to FIG. 2G briefly illustrates the unit cell of three kinds of three-dimensional trace styles of one exemplary embodiment that uses the proposed three-dimensional complementary-conducting-strip structure to form the coupled lines respectively.
Figure 2B:
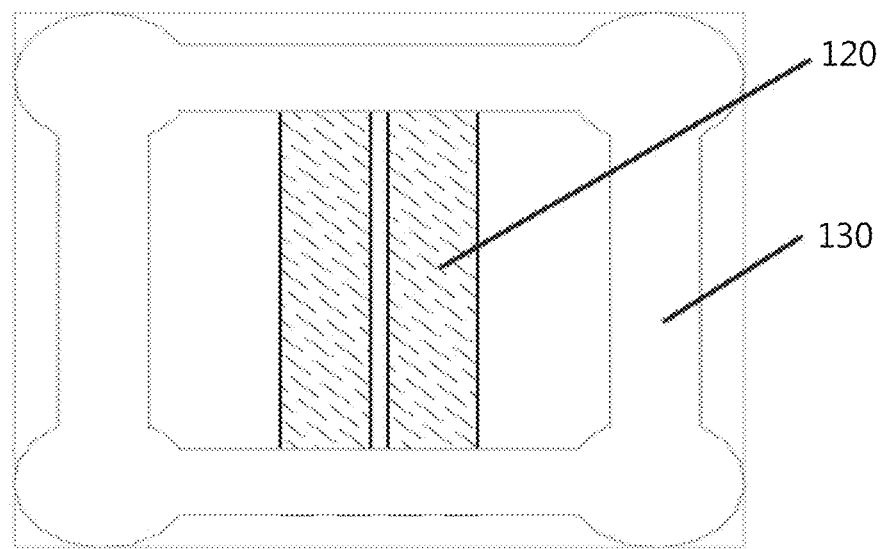
Figure 2C:
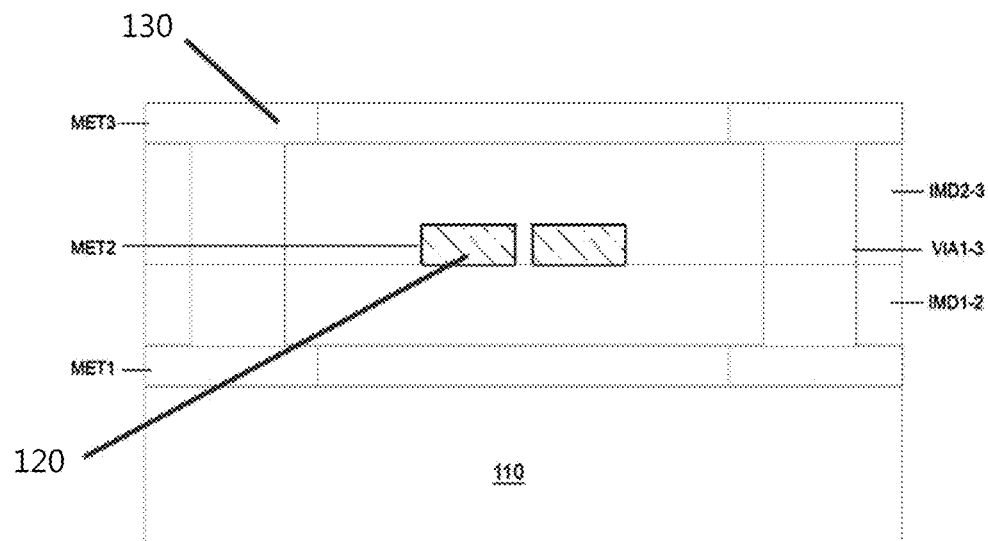
Figure 2D:
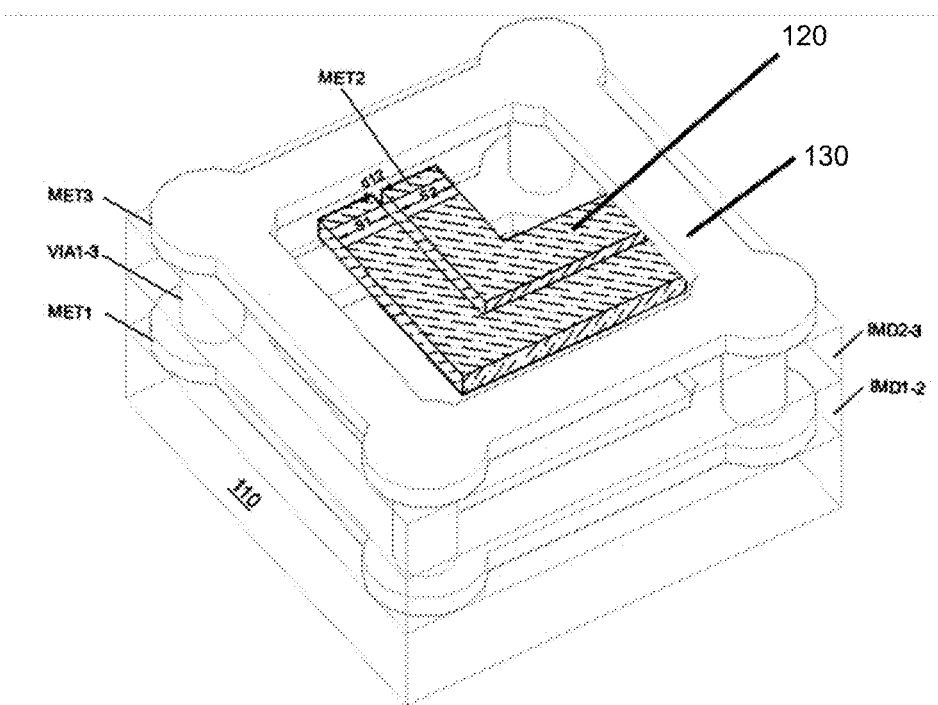
Figure 2E:
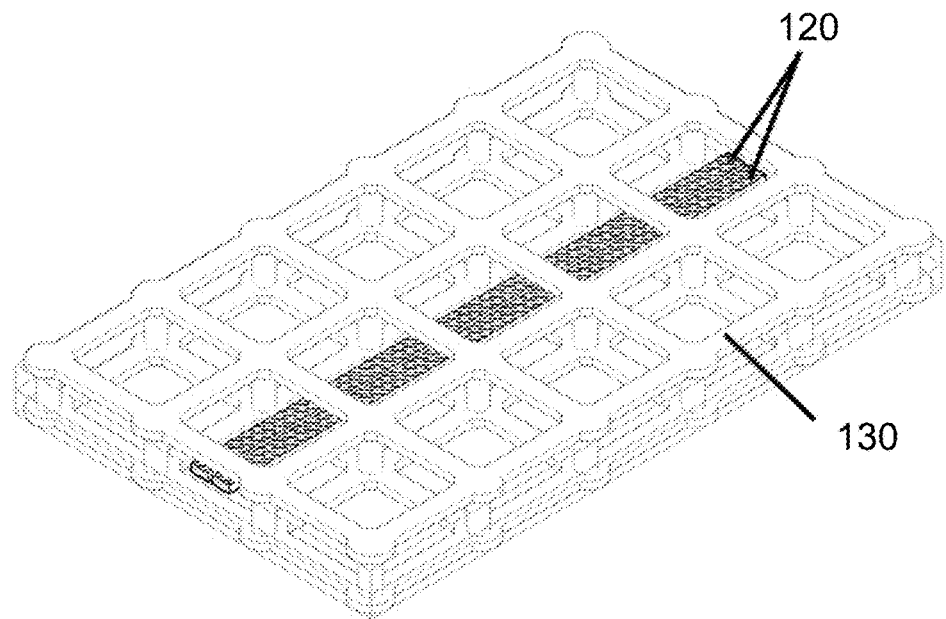
Figure 2F:
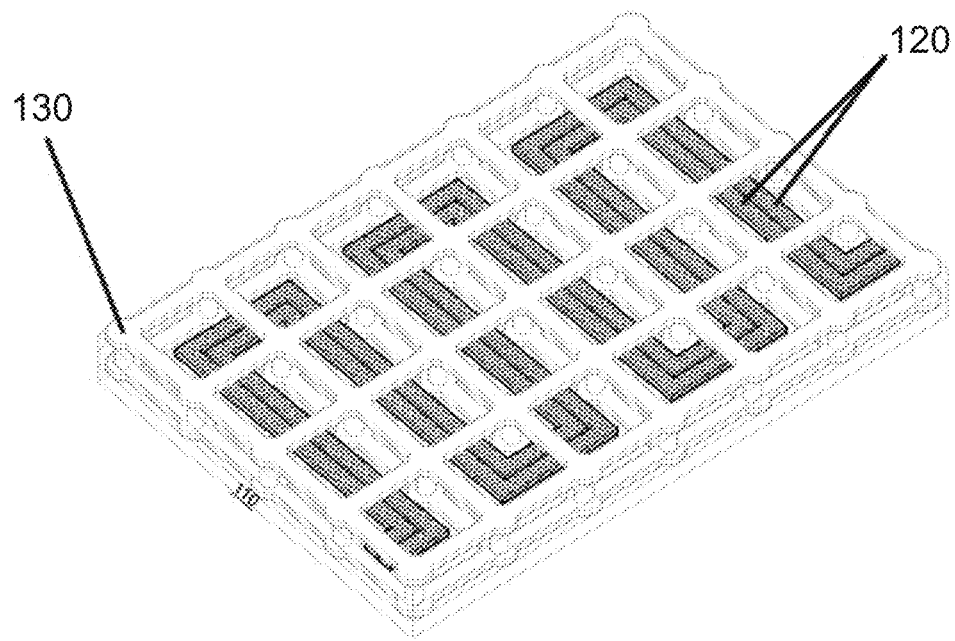
Figure 2G:
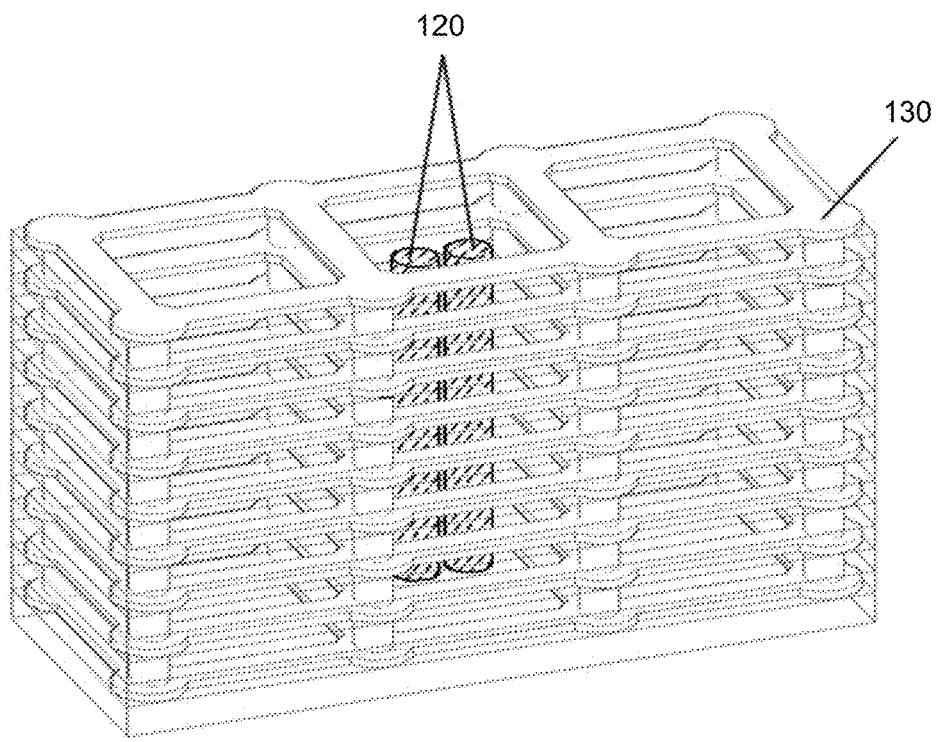
Figure 3A:
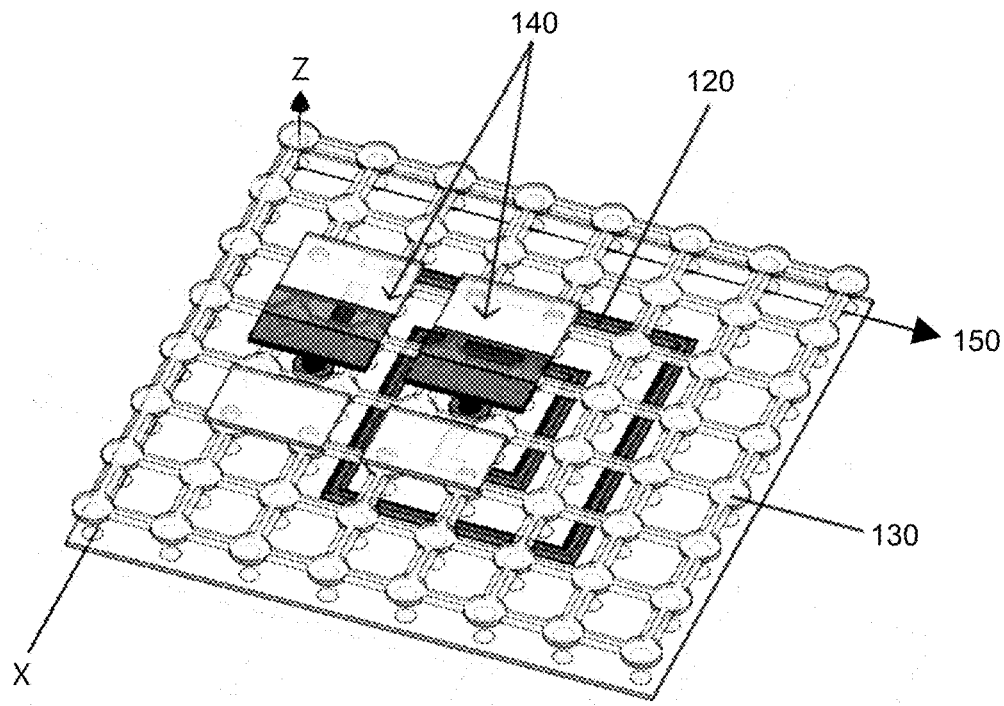
FIG. 3A to FIG. 3D、FIG. 3E to FIG. 3H and FIG. 3I to FIG. 3L briefly illustrates the oblique view, the bottom view and the side view of the following three application of the signal lines respectively: traces spirally along the horizontal direction, traces spirally along the vertical direction and traces spirally along both the horizontal direction and the vertical direction.
Figure 3B:
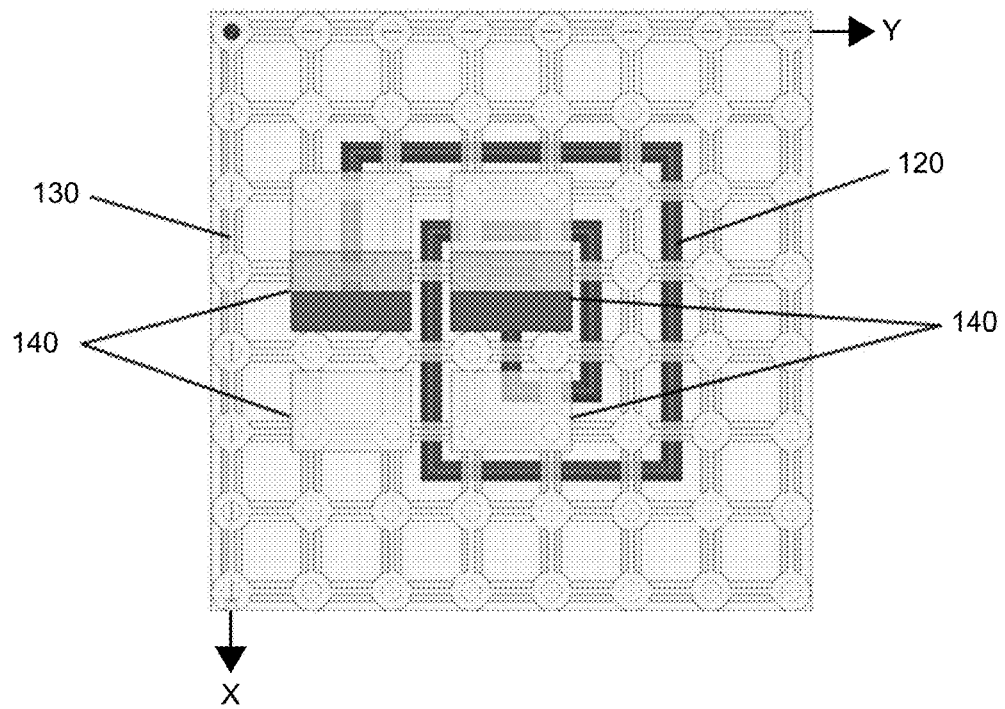
Figure 3C:
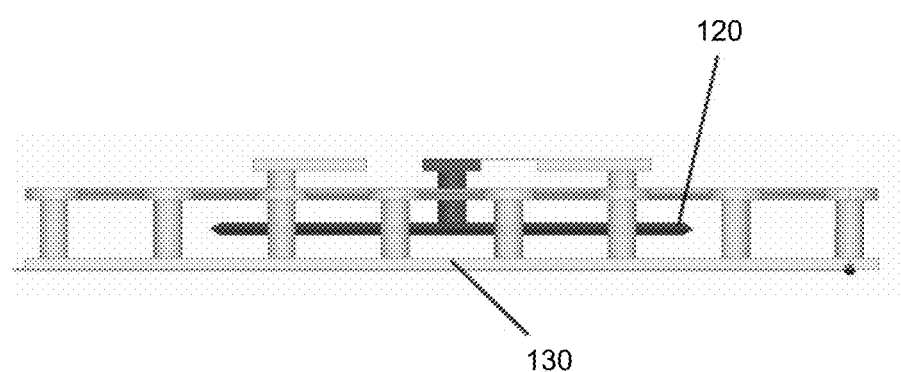
Figure 3D:
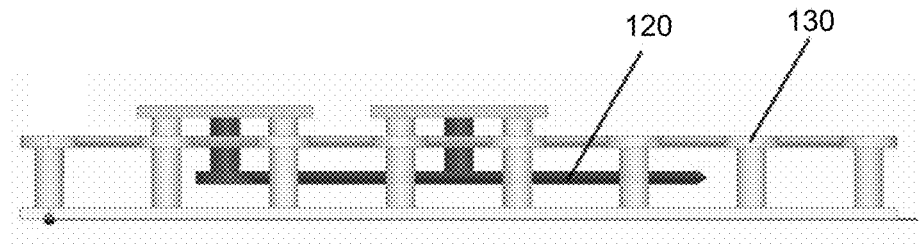
Figure 3E:
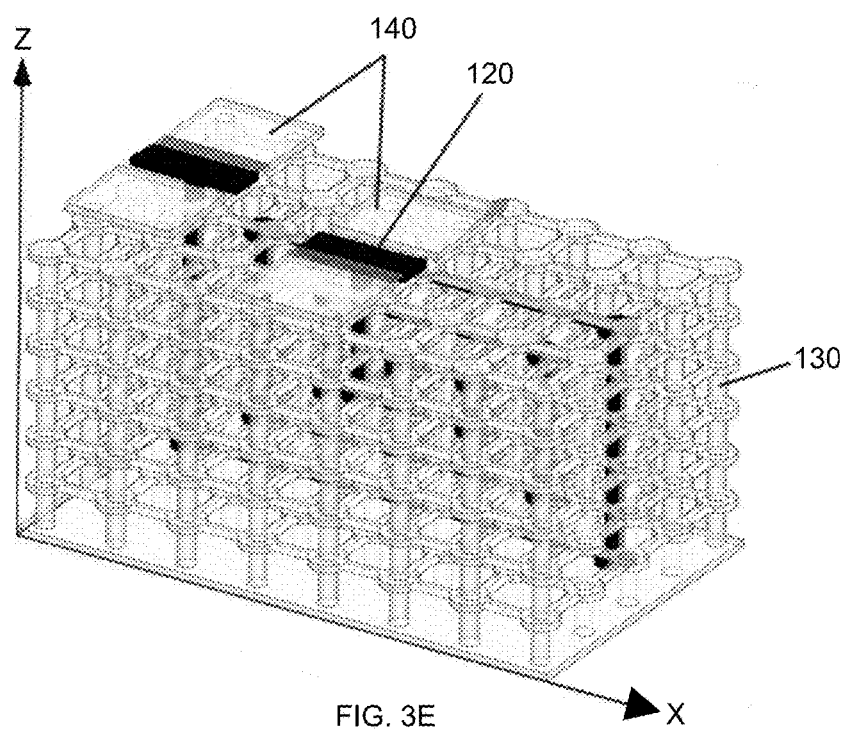
Figure 3F:
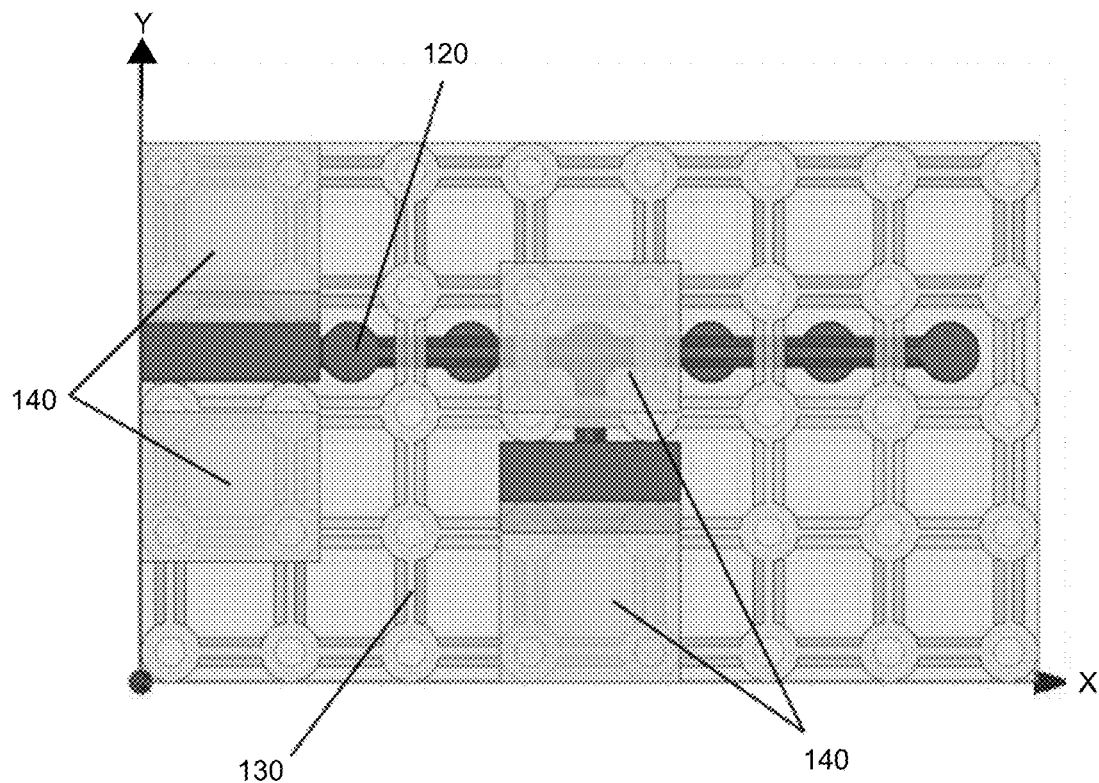
Figure 3G:
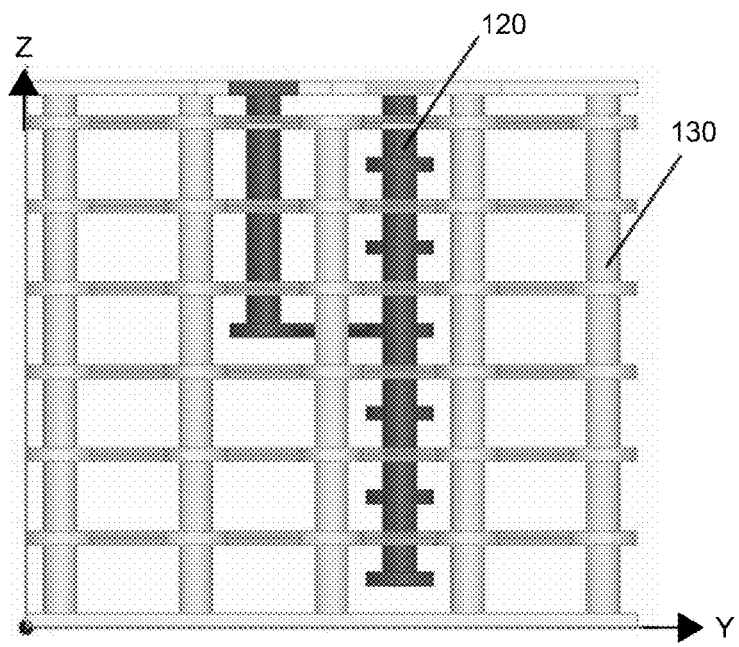
Figure 3H:
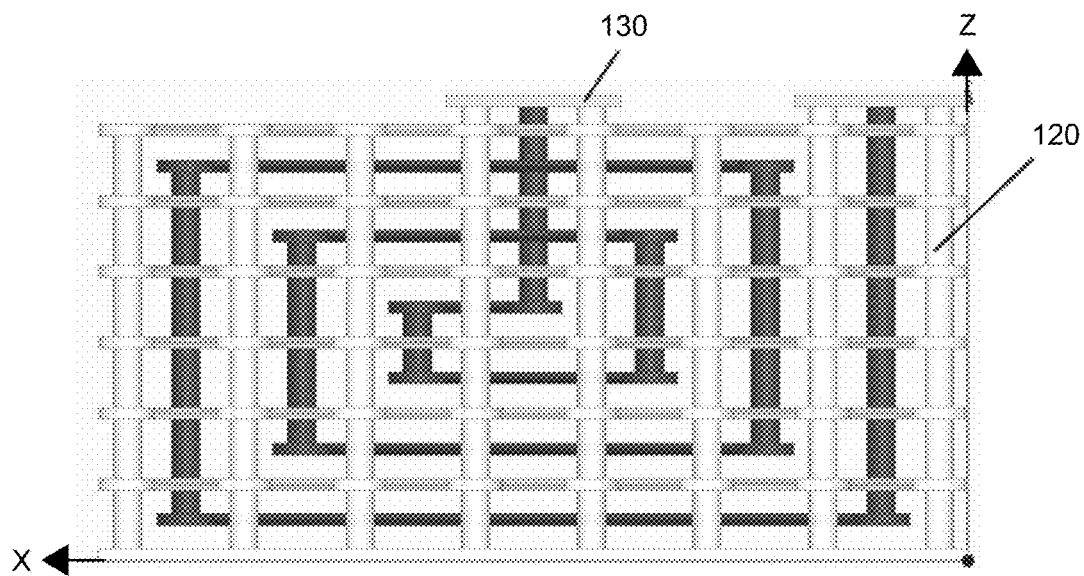
Figure 3I:
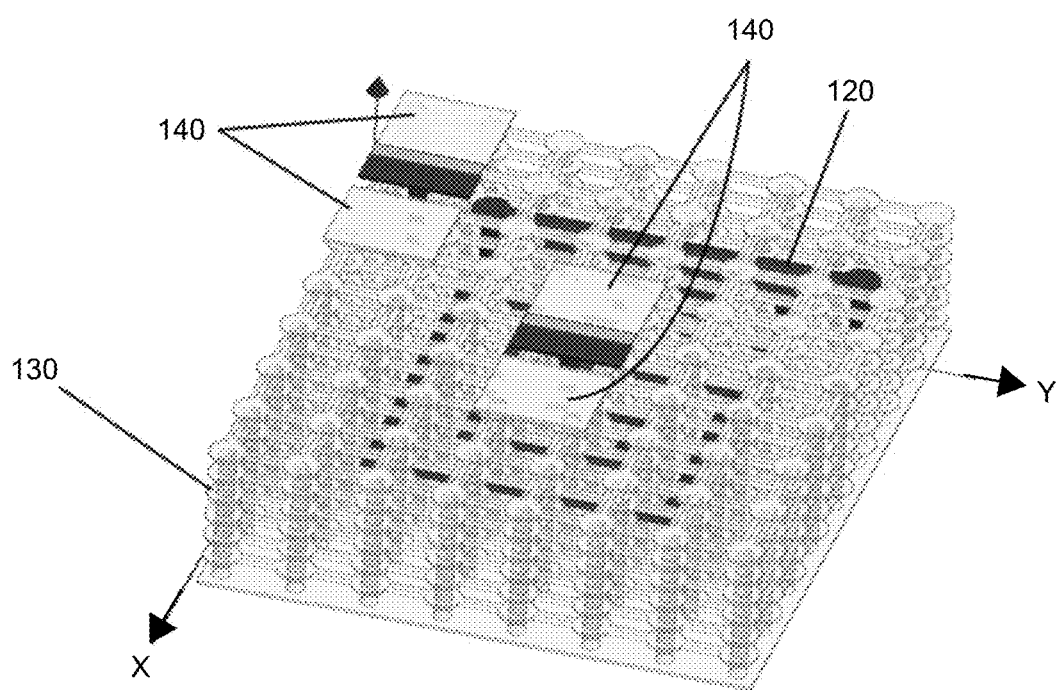
Figure 3J:
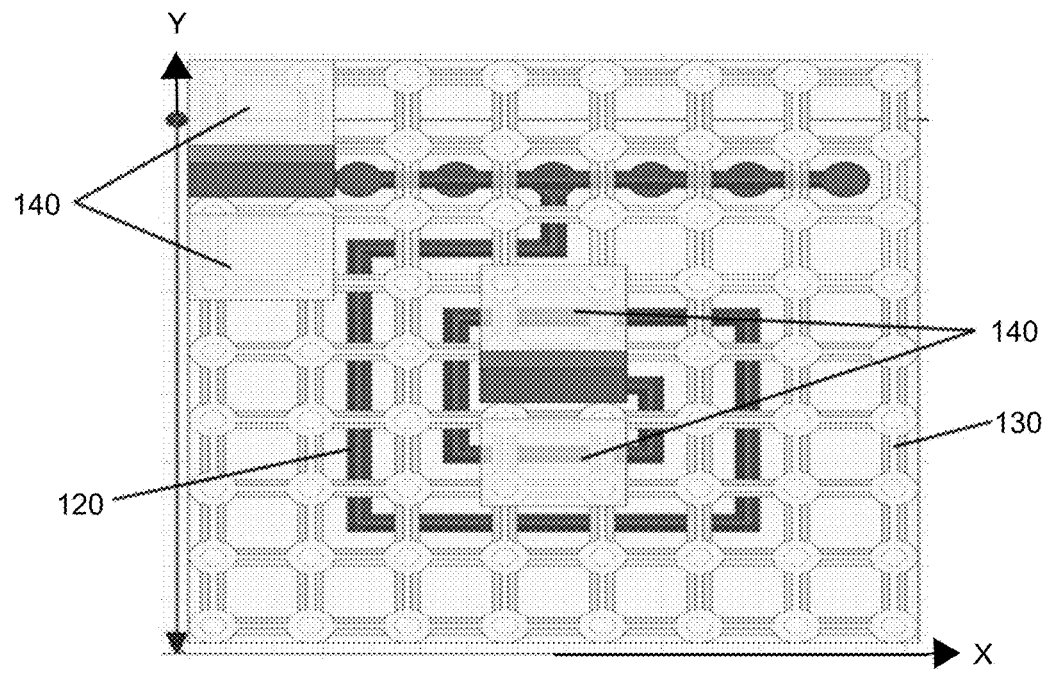
Figure 3K:
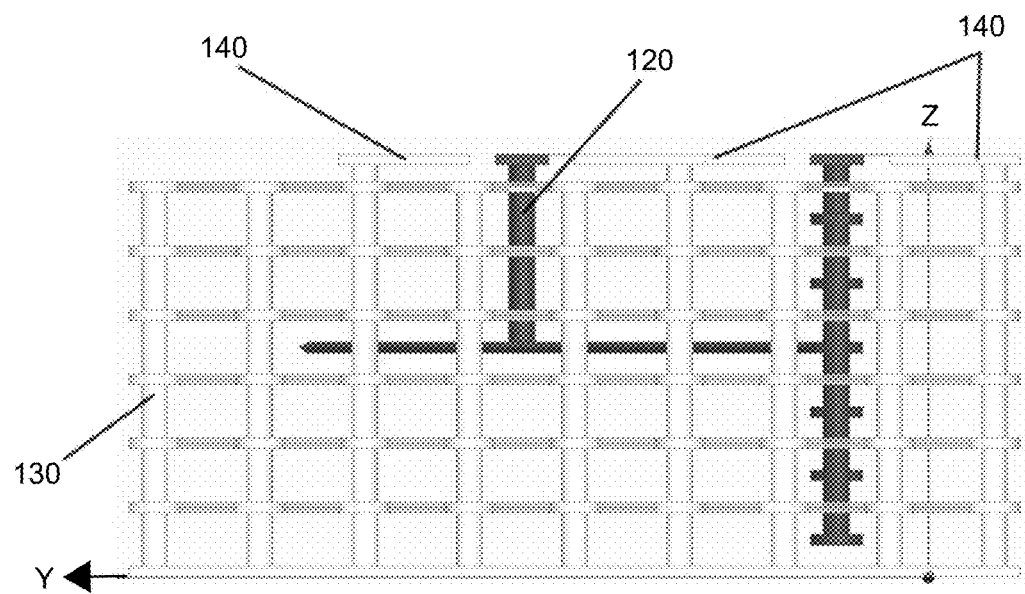
Figure 3L:
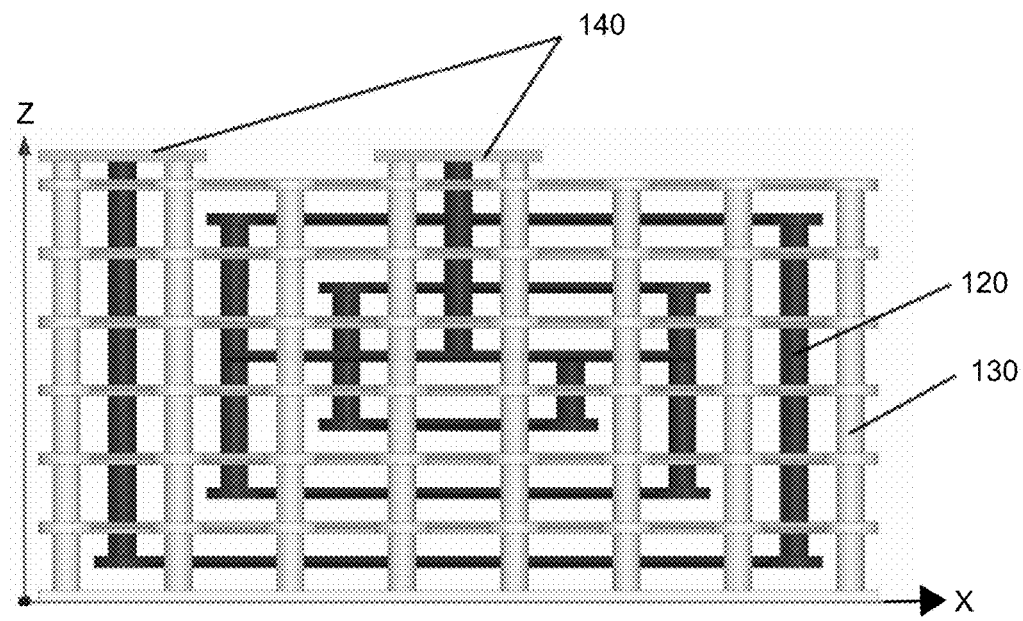

FIG. 1A briefly illustrates the oblique view of one exemplary embodiment that uses the proposed three-dimensional complementary-conducting-strip structure to form the transmission line, FIG. 1B is the corresponding bottom view and FIG. 1C and FIG. 1D are the corresponding side views based on different viewpoints. The three-dimensional complementary-conducting-strip structure 100 is positioned on the substrate 110 and has at least some metal layers (MET1、MET2、MET3 . . . 、MET10 and MET 11) vertically stacked along a direction vertical to the surface of the substrate 110 and some inter-metal dielectric layers (IMD) ($IMD_{1-2}$、$IMD_{2-3}$、 . . . 、$IMD_{10-11}$) alternatively positioned between adjacent metal layers (or viewed as embedded inside adjacent metal layers). Each of Met1、MET3 . . . 、MET11 is a planar metal layer with at least one empty area, i.e., may be viewed as a two-dimensional mesh metal layer. Each of MET 2、MET4 . . . 、MET10 is at least one metal layer which positioned on the same plane (or viewed as positioned between two adjacent two-dimensional mesh metal layers), i.e., may be viewed as a signal line metal layer. Further, different metal lines positioned on different planes (or viewed as different signal line metal layers) are connected mutually through one or more signal lines vias to form signal lines 120 that may trace horizontally and/or vertically. Because the exemplary embodiment is applied to form the transmission line, each unit cell of the three-dimensional network structure 130 has one and only one signal line 120 when the three-dimensional network structure 130 is the combination of these two-dimensional mesh metal layers and these two-dimensional mesh metal layers used to connect these two-dimensional mesh metal layers. Significantly, the three-dimensional network structure 130 may be as the three-dimensional arrangement of numerous unit cells. For each unit cell, the two opposite sides along the Z direction vertical to the substrate surface are two adjacent two-dimensional mesh metal layers and the two opposite sides along the X-directions and the Y-direction parallel to the substrate surface are defined by the neighboring two-dimensional mesh vias respectively. Significantly, as shown in FIG. 1A to FIG. 1D, for each unit cell, these signal lines have one or more of the following trace styles: single line along the horizontal direction, meander line along the horizontal direction, single line along the vertical direction and meander line along the vertical direction. Hence, each signal line may trace three-dimensionally arbitrarily inside the three-dimensional network structure 130, no matter meander line on any plane or straight line along any direction. Further, these signal lines pass through these empty areas along the direction vertical to the surface of the substrate 100, and pass through the gaps between these two dimensional mesh vias along the direction parallel to the surface of the substrate 100.

In general, these inter-metal dielectric layers surround at least these signal lines, these two-dimensional mesh vias and these two-dimensional mesh metal layers, also usually fill up the gaps between these signal lines, these two-dimensional mesh vias and these two-dimensional mesh metal layers. Moreover, to reduce the effect of capacitance coupling or others, these inter-metal dielectric layers usually are made of dielectric materials) with low dielectric coefficient(s). In the practical applications, the two ends of any signal line usually are connected to different elements and/or different terminals. For example, the source/drain/gate of the metal-oxide-semiconductor transistor, the terminals of the capacitor or the inductor, the interface(s) connected to the outside environment of the integrated circuit, and so on. Besides, although not particularly illustrate in these figures, the three-dimensional network structure 130 usually is electrically connected a potential reference point in the practical applications, such as the potential reference point of the substrate 110 or the potential reference point of other semiconductor device position in the substrate 110.

It should be emphasized that the three-dimensional complementary-conducting-strip structure proposed by this invention may be applied to form the transmission line or to form the coupled lines, even may be applied to form other products. In other words, the number of the signal line in each unit cell may be not limited, also the shapes and the trace styles of the one or more signal lines may not be limited. The invention only requires that these signal lines are separated mutually and also are separated from the tree-dimensional network structure 130.

For example, FIG. 2A to FIG. 2G briefly illustrates the situation that the proposed three-dimensional complementary-conducting-strip structure is applied to form the coupled lines. FIG. 2A to FIG. 2D briefly illustrate the unit cell, and FIG. 2E to FIG. 2C briefly illustrate three examples of the three-dimensional trace styles. For example, FIG. 3A to FIG. 3D briefly illustrates the oblique view, the bottom view and the side view when the signal lines trace spirally along the horizontal direction respectively, FIG. 3E to FIG. 3H briefly illustrates the oblique view, the bottom view and the side view when the signal lines trace spirally along the vertically direction respectively, and FIG. 3I to FIG. 3L briefly illustrates the oblique view, the bottom view and the side view when the signal lines trace spirally along the horizontal direction and the vertical direction. In addition, to simplify the figures, the signal line 130 is expressed by the dark pattern, but both these two-dimensional mesh metal layers and these two-dimensional mesh vias (even substrate 110) are expressed by light pattern, so as to highlight how the signal lines trace three-dimensionally inside the proposed three-dimensional complementary-conducting-strip structure. Further, port 140 is the interface between the signal line 120 and the outside environment outside the three-dimensional complementary-conducting-strip structure. The invention does not limit the details of the port 140, any well-known or to-be-appeared technology and product may be used to form the port 140.

As shown in these figures, whole the three-dimensional complementary-conducting-strip structure may be viewed as the three-dimensional stack of numerous unit cells, or may be viewed as numerous unit cells stacked three-dimensionally and numerous signal lines trace three-dimensionally inside these unit cells. Of course, the unit cell in the former description is slightly different than the unit cell in the latter description, because the former unit cell include the signal line(s) itself but the latter unit cell does not include the signal line(s). However, no matter which description, to compare with the conventional two-dimensional complementary-conducting-strip structure, the three-dimensional complementary-conducting-strip structure proposed by this invention not only may allow three-dimensional trace style of one or more signal lines, but also may separate and screen two or more signal lines positioned on the same plane (or between two adjacent two-dimensional mesh metal layers) by the two-dimensional mesh vias (even by partial mesh metal layers).

Figure 4A:
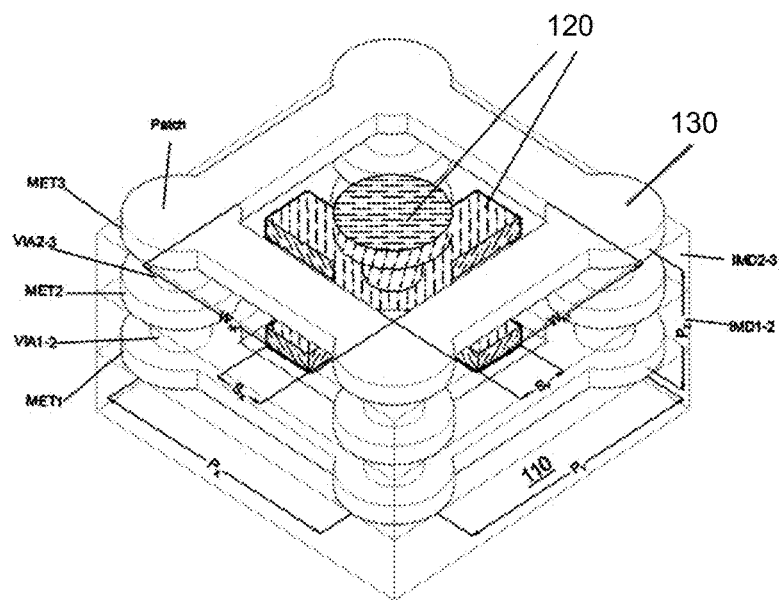
FIG. 4A to FIG. 4C briefly illustrate the oblique view, the top view and the side view of the unit cell of one exemplary embodiment that uses the proposed three-dimensional complementary-conducting-strip structure to form the transmission line.
Figure 4B:
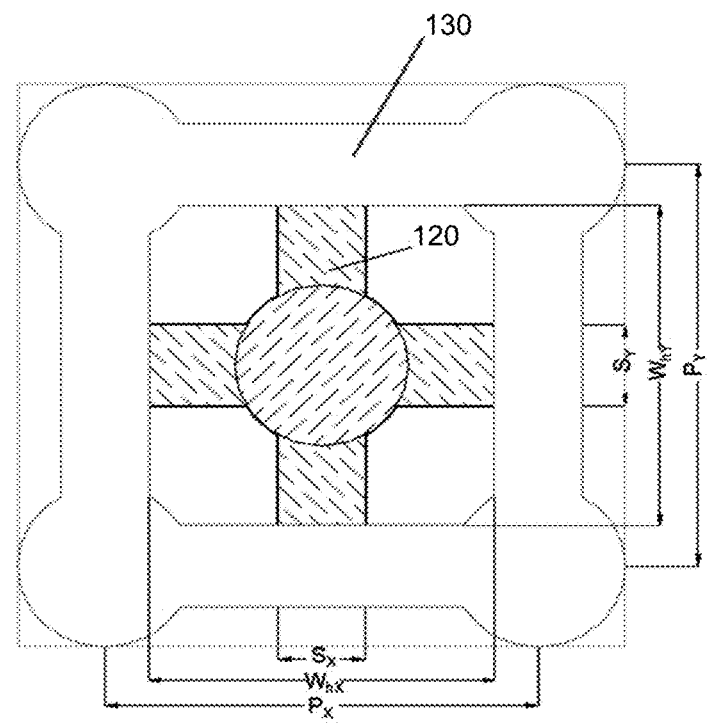
Figure 4C:
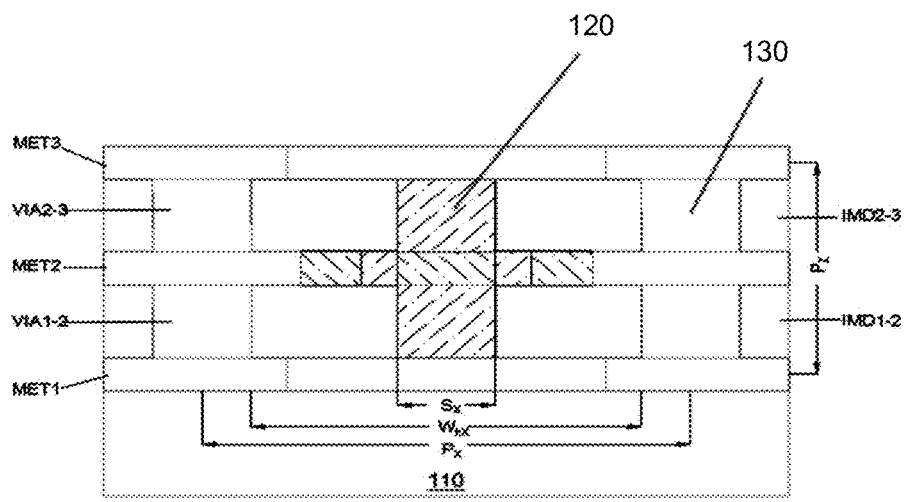

FIG. 4A to FIG. 4C briefly illustrate the oblique view, the top view and the side view of the unit cell which uses the proposed two-dimensional complementary-conducting-strip structure, wherein the exemplary situation is the transmission line but the details of the unit cell also may be used to form the coupled lines or others. These metal layers MET 1 and MET 3 are the two-dimensional mesh metal layers and the metal layer MET 2 is the signal line metal layer, also the cylindrical metal patch(es) positioned on all metal layers and the via(s) embedded in these inter-metal dielectric layers are used to connect different metal layers, no matter to connect the metal layer MET 1 with the metal layer MET 3 or to connect the metal layer MET 2 with the metal layer inside other unit cell. Of course, the cylindrical metal patch is only is an example, different examples also may use metal patch(es) having other shapes, even different examples may directly connects the two-dimensional mesh metal layer with the metal via(s) without using any patch, also different examples may omit the path in the situation that the design and the fabrication may omit it. Significantly, by arbitrarily three-dimensionally arrange and combine these unit cells, different three-dimensional network structures 130 may be acquired (especially three-dimensional network structure 130 having special period). Significantly, on the proposed three-dimensional complementary-conducting-strip structure, not only the signal lines may trace along the X, Y, −X and −Y directions on the horizontal plane as on the conventional two-dimensional complementary-conducting strip structure, but also the signal lines may trace vertically through the vertical metal vias (even patch) to trace vertically along the Z and −Z direction when the conventional two-dimensional complementary-conducting strip structure can not allow the signal lines to trace vertically. Therefore, inside each unit cell, the signal lines may be connected to the signal lines inside other unit cells via one or more of the X, −X, Y, −Y, Z and −Z direction so as to form three-dimensional signal lines with variable trace styles. In these figures, the connecting arm presents such connection mechanism.

As shown in these figures, these unit cells of the three-dimensional network structure 130 has unit cell period Px and Py along the X direction and the Y-direction on the horizontal plane and unit cell period Pz along the vertical Z-direction, also the unit cell size (or viewed as mesh size) along the horizontal X and Y direction and vertical Z direction is Whx, Why and Whz respectively, and signal line size along the horizontal X and Y direction and vertical Z direction, i.e., length, width and thickness, is Sx, Sy and Sz respectively. In general, the design of the three-dimensional complementary-conducting-strip structure has to refer to the following factors for ensuring the value of Px, Py and Pz: the required range of the characteristic impedance of the signal line, the minimal linewidth and the minimal line space achieved by the factory fabrication, and the maximum load current of the signal line. Further, the minimal size of each of the Sx, Sy and Sz is decided by the limitation of the factory fabrication and the required design rule. Moreover, by adjusting Whx, Why, Whz, Sx, Sy and Sz, the characteristic impedance and other characters of the three-dimensional complementary-conducting-strip structure may be adjusted. In general, the commercial factory fabrication fixes Sz but adjust Sx and Sy. In general, each of the unit cells of whole the three-dimensional complementary-conducting-strip structure has same period and same size, also the size of the signal line positioned inside is the same, so as to simplify the structure and related fabrication. Nevertheless, for different exemplary embodiments, it is optional that different unit cells positioned on different layers along the vertical direction may have different unit cell periods, different unit cell sizes and/or different signal line sizes, it is also optional that different unit cells have different unit cell periods and/or different unit cell sizes, and it is still optional that different unit cells have different signal line amounts, different size line sizes and/or different signal line trace styles.

By comparing with the conventional two-dimensional complementary-conducting-strip structure, the three-dimensional complementary-conducting-strip proposed by the invention has at least the following advantages. First, more design parameters provide more design flexibility. Second, each signal line is surrounded by the three-dimensional network structure and then the screen effect on the signal line may reduce the interference between different signal lines. Third, the three-dimensional network structure is beneficial for heat dissipation, and then the noise and/or the failure induced by heat generated during the operation period and not dissipated effectively may be minimized. Particularly, the area of the substrate may be effectively used and then the density of the integrated circuits may be enhanced, because the signal lines may trace three-dimensionally inside the three-dimensional network structure.

First of all, both the invention and the conventional two-dimensional complementary-conducting-strip structure have six adjustable parameters on the horizontal plane (X and Y directions) such as signal line size (Sx, Sy), unit cell period (Px, Py) and unit cell size (Whx, Why), but the invention may further have signal line size (Sx), unit cell period (Pz) and unit cell size (Whz) along the vertical direction (Z direction). Hence, the invention may have more adjustable parameters than the conventional two-dimensional complementary-conducting-strip structure, and then may provide more adjustment flexibility. Of course, no matter along which direction, the adjustment range of each adjustable parameter is related to at least the factory fabrication and the product specification. Besides, among these directions, the adjustment range of each adjustable parameter may be adjusted respectively. That is to say, depends on the requirement of the three-dimensional complementary-conducting-strip structure (such as the frequency and the wavelength of the signal to be transmitted through the signal lines), these parameters along the three directions (X-direction, Y-direction and Z-direction) may be adjusted correspondingly. For example, in the situation that the three-dimensional complementary-conducting-strip structure is used to form the three-dimensional periodic waveguide structure, each of the Px, Py and Pz has to be obviously smaller than the wavelength ($\lambda$g) of the wave guided through.

Secondarily, to compare with the conventional complementary-conducting-strip structure that only the upper sides and/or the bottom sides of the signal lines along the vertical direction may be screened by these two-dimensional mesh metal layers (these two-dimensional mesh metal layers usually is grounded), the invention not only may screen the signal lines by using these horizontal two-dimensional mesh metal layers but also may screen the signal lines by using the two-dimensional mesh vias used to connect these two-dimensional mesh metal layers. Hence, the signal lines between different unit cells may be screened along all of the three-dimensional directions, so that the interference between one or more signal lines positioned inside different unit cells may be reduced.

Next, due to the good heat conductivity of the metal, because the signal lines inside each unit cell of the three-dimensional complementary-conducting-strip structure are surrounded by the metals, no matter the metal of the two-dimensional mesh metal layers or the metal of the two-dimensional mesh vias, the invention may more effectively dissipate the heat appeared on the signal lines away whole the complementary-conducting-strip structure than the conventional complementary-conducting-strip structure, especially if these metals are grounded. Hence, in the situation that the signal lines are electrically connected to the active device or the high-power component, to compare with the conventional two-dimensional complementary-conducting-strip structure, the three-dimensional complementary-conducting-strip structure proposed by the invention may more effectively minimize the risk of noise and/or failure of an overheated element of the integrated circuits induced by the heat appeared on the signal lines.

Particularly, to avoid the problems of short circuit or noise appeared it the situation that two signal lines contact mutually or extremely close to each other, a signal line must roundabout around another signal line on a two-dimensional plane in the conventional two-dimensional complementary-conducting-strip structure, but a signal may cross above or below another signal line in the proposed three-dimensional complementary-conducting-strip structure. Hence, the invention may omit the substrate area occupied by the roundabout signal lines, and then may further increase the density of the integrated circuit.

Figure 5A:
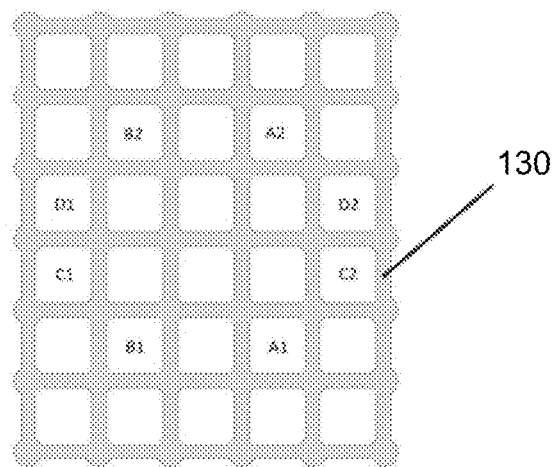
FIG. 5A briefly illustrates the distribution of the elements need to be connected, FIG. 5B briefly illustrates the trace style of the signal lines by using the conventional two-dimensional complementary-conducting-strip structure, FIG. 5C briefly illustrates the trace style of the signal lines by using the proposed three-dimensional complementary-conducting-strip structure, FIG. 5D to FIG. 5E briefly illustrates the situation that all signals are positioned on the same plane respectively, FIG. 5F to FIG. 5G briefly illustrates the situation that all signal lines are positioned to two adjacent planes along the vertical direction, and FIG. 5H to FIG. 5I briefly illustrates the situation that all signal lines are positioned on four adjacent planes along the vertical direction.
Figure 5B:
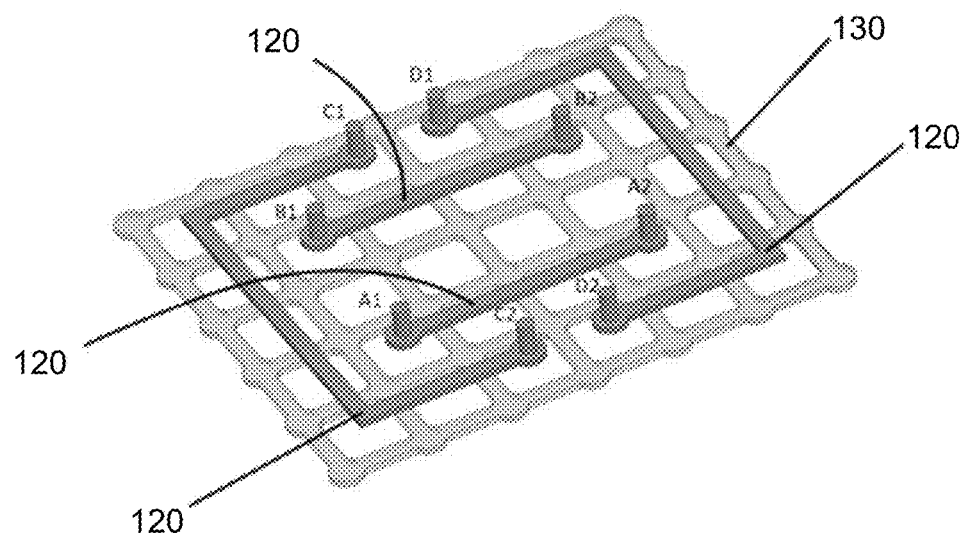
Figure 5C:
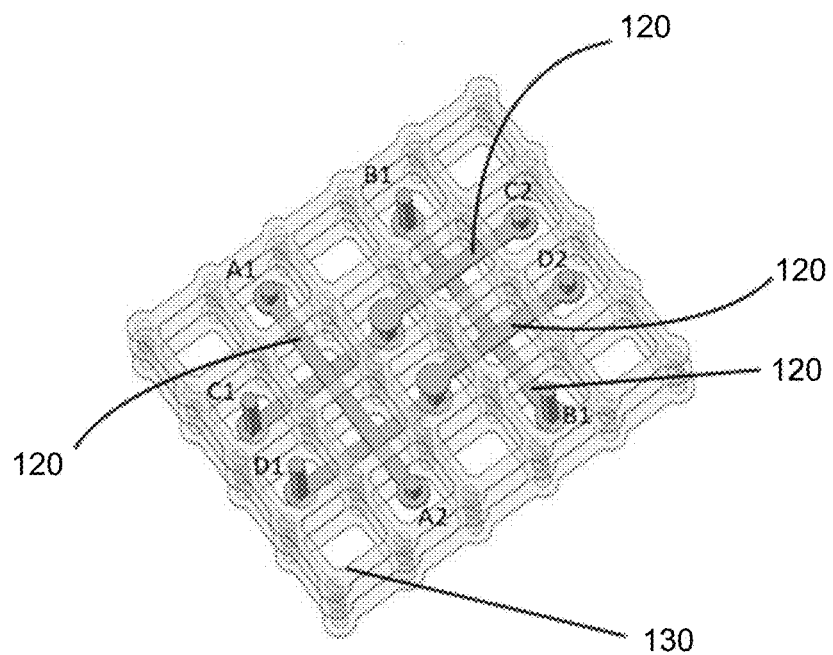

For example, FIG. 5A to FIG. 5C briefly illustrate how the invention may save the substrate area and may increase density than the conventional two-dimensional complementary-conducting-strip structure. It should be emphasized the trace style is independent on whether is applied to form the transmission line or the coupled line, in other words, the invention' advantages shown in these figures is not established for the transmission line. FIG. 5A briefly illustrates the distribution of the elements (or viewed as terminals) to be connected, wherein A1, B1, C1 and D1 is connected to A2, B2, C2 and D2 through different signal lines respectively. FIG. 5B briefly illustrates the trace style of the signal lines in the conventional two-dimensional complementary-conducting-strip structure, wherein only half of these signal lines are straightly traced, but another half of these signal lines are roundabout traced around these straight signal lines. As shown in these figures, in such situation, the edge of the occupied substrate area is five unit cells and six unit cells along the horizontal X direction and the horizontal Y direction respectively. FIG. 5C briefly illustrates the trace style of the signal lines in the proposed three-dimensional complementary-conducting-strip structure, wherein only half of these signal lines are straightly traced but another half of these signal lines bypass the straight signal lines positioned on the same plane by vertically tracing to move to other horizontal plane(s) and to be traced on the other horizontal plane(s). As shown in these figures, in such situation, the edge of the occupied substrate area is four unit cells and five unit cells along the horizontal X direction and the horizontal Y direction respectively. Significantly, the three-dimensional the edge of the occupied substrate area is five unit cells and six unit cells along the horizontal X direction and the horizontal Y direction respectively. Significantly, the usage of the three-dimensional complementary-conducting-strip structure may reduce the occupied substrate area and increase the density. To simplify the drawings, only the signal line 120 and the three-dimensional network structure 130 are presented.

Figure 5D:
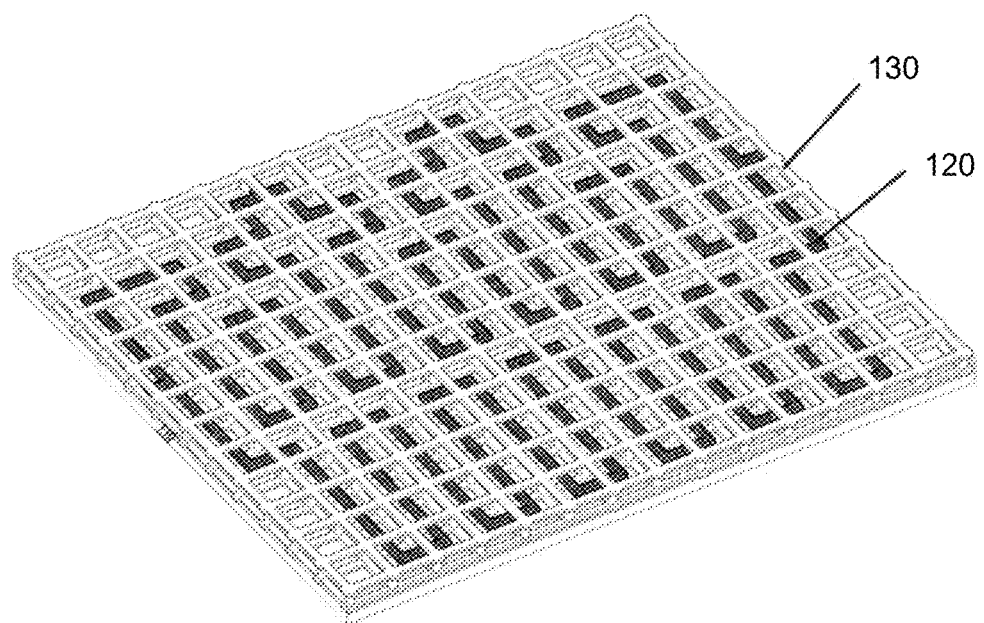
Figure 5E:
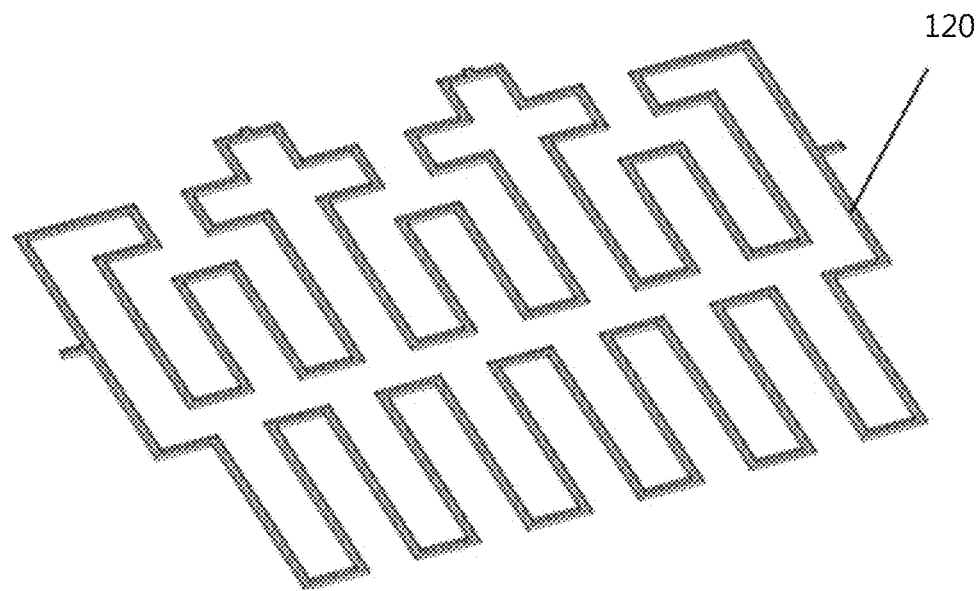
Figure 5F:
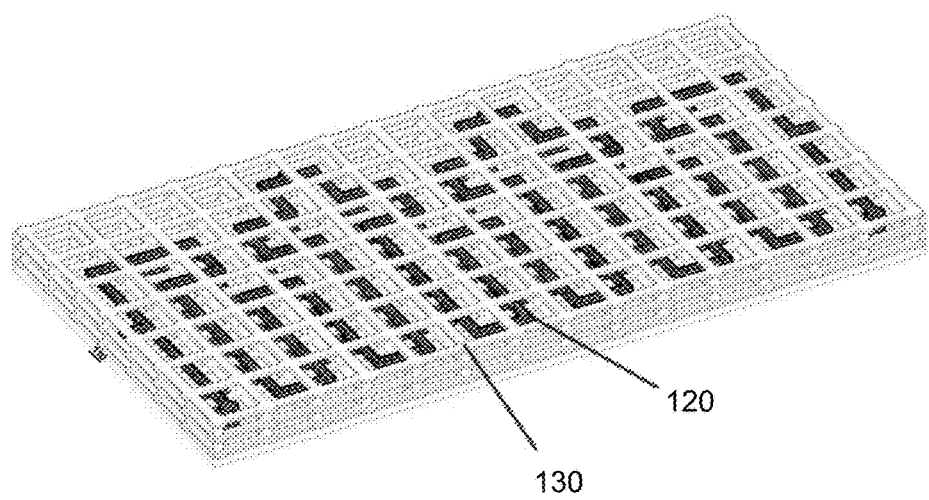
Figure 5G:
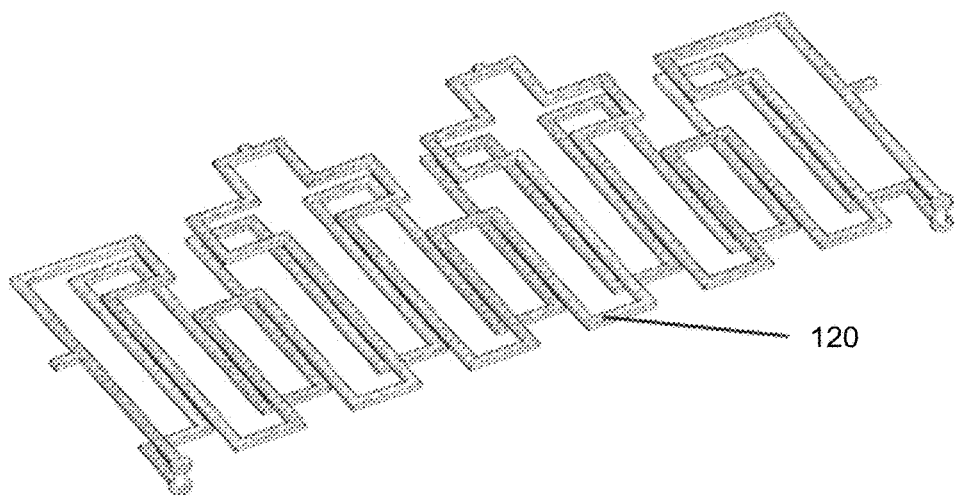
Figure 5H:
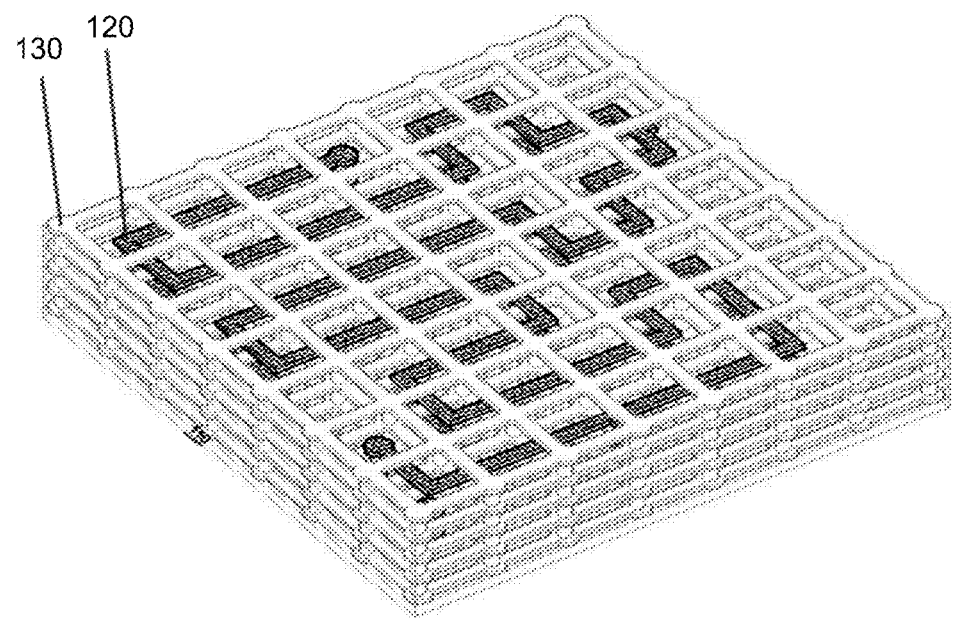
Figure 5I:
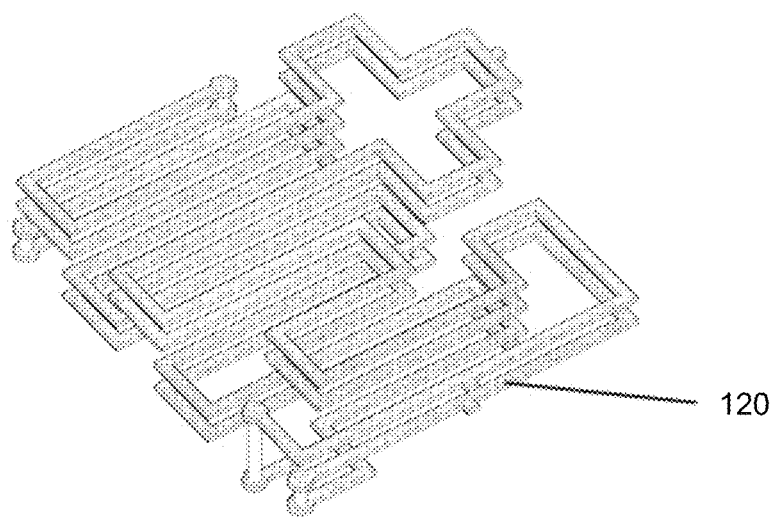

For example, FIG. 5D to FIG. 5I present some other examples. FIG. 5D and FIG. 5E present the situation that all signal lines are positioned in the same plane (or viewed as between two two-dimensional mesh metal layers), FIG. 5F and FIG. 5G present the situation that all signal lines are distributed in two vertically adjacent planes (or viewed as alternatively positioned between three two-dimensional mesh metal layers), and FIG. 5H and FIG. 5I present the situation that all signal lines are distributed in four vertically adjacent planes (or viewed as alternatively positioned between five two-dimensional mesh layers). Significantly, in the situation that all signal lines are positioned in two vertically adjacent planes, to compare with the situation that all signal lines are positioned in the same plane, forty-five percent of the substrate area may be saved. Also, in the situation that all signal lines are positioned in four vertically adjacent planes, to compare with the situation that all signal lines are positioned in the same plane, seventy percent of the substrate area may be saved. To simplify the drawings, only the signal line 120 and the three-dimensional network structure 130 are presented.

In short, although not yet particularly present the situation that more elements have to be connected or the situation that the distribution of these elements over the substrate is more complex, because the requirements of the roundabout trace style to avoid the connection between different signal lines is proportion to the number of these elements to be connected and the complexity of the distribution of these elements, the advantages of the proposed three-dimensional complementary-conducting-strip structure is more significantly whenever the number of these elements to be connected is larger and the distribution of these elements is more complex.

Furthermore, the inventions' three-dimensional complementary-conducting-strip structure has more adjustable parameters than the conventional two-dimensional complementary-conducting-strip structure. Hence, not only better isolation/heat-dissipation between different unit cells may be achieved and how the signal lines are traced may be improved for the transmission line, the coupled line and other applications, but also both the characteristic impedance and the quality factor may be increased compliance with the factory fabrication, even the effect of the slow wave factor may be reduced.

For example, in the situation that the proposed three-dimensional complementary-conducting-strip structure is applied to form the microwave/millimeter wave integrated circuits, it may be used to support the transverse electromagnetic transmission mode and also may reduce the effect of the signal lines trace style (such as meander segment) on the propagation constant ($\gamma$) and the characteristic impedance when compared with some well-known technologies. As well-known, the complex propagation constant ($\gamma$) may be expressed as $\gamma=\alpha+j\beta$, wherein $\alpha$ is the attenuation constant and $\beta$ is the phase constant. By calculating the S parameter of a two-terminals signal line used to form the transmission line, the characteristic impedance, the attenuation constant ($\alpha$), the phase constant ($\beta$) and the qualify factor may be acquired. The related calculation formulas are listed as below:

$$e^{\gamma L} = \frac{1 - S_{11}^2 + S_{21}^2 + \sqrt{(1 + S_{11}^2 - S_{21}^2) - (2S_{11})^2}}{2S_{11}}$$

$$Z_C = Z_0 \sqrt{\frac{(1 + S_{11}^2) - S_{21}^2}{(1 - S_{11}^2) - S_{21}^2}}$$

$$Q = \frac{\beta}{2\alpha}$$

As well-known, in the ideal situation, both the characteristic impedance and the slow wave factor are not changed with the variation of the transmitted signals, and the qualify factor is proportional to the frequency of the transmitted signal in the range of one-fourth wavelength of the transmitted signal.

Figure 6A:
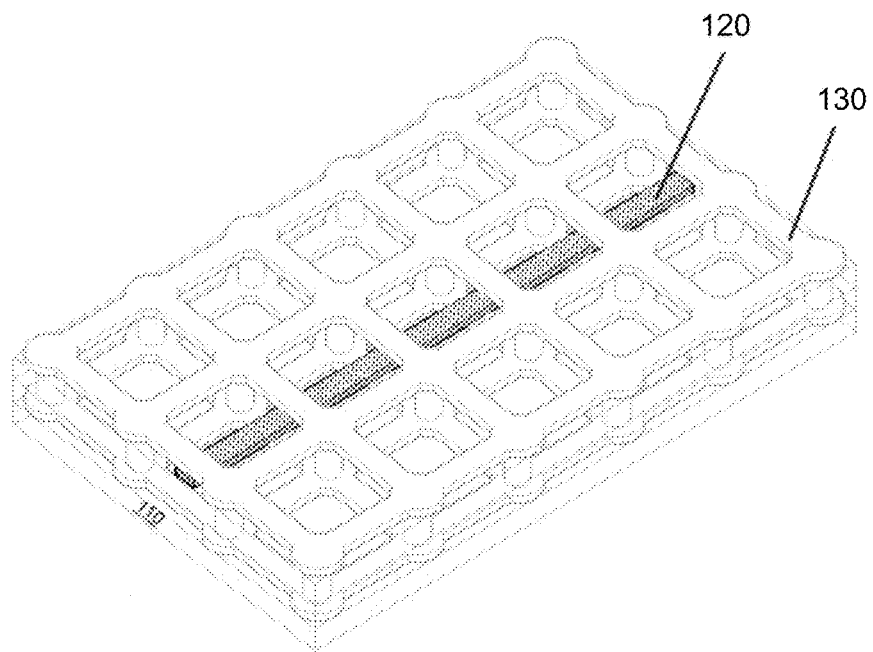
FIG. 6A briefly illustrates the signal transmission line situation and FIG. 6B to FIG. 6D presents the corresponding simulation result of the relation between the transmitted signal frequency and the characteristic impedance, the show wave factor and the quality factor in the situation respectively, FIG. 6E briefly illustrates the single meander line situation and FIG. 6F to FIG. 6H presents the corresponding simulation result of the relation between the transmitted signal frequency and the characteristic impedance, the show wave factor and the quality factor in the situation respectively, FIG. 6I to FIG. 6K presents the corresponding simulation result of the relation between the transmitted signal frequency and the characteristic impedance, the show wave factor and the quality factor in the application shown in FIG. 3A to FIG. 3D respectively, FIG. 6L to FIG. 6N presents the corresponding simulation result of the relation between the transmitted signal frequency and the characteristic impedance, the show wave factor and the quality factor in the application shown in FIG. 3E to FIG. 3H respectively, and FIG. 6O to FIG. 6Q presents the corresponding simulation result of the relation between the transmitted signal frequency and the characteristic impedance, the show wave factor and the quality factor in the application shown in FIG. 3A to FIG. 3D respectively.
Figure 6B:
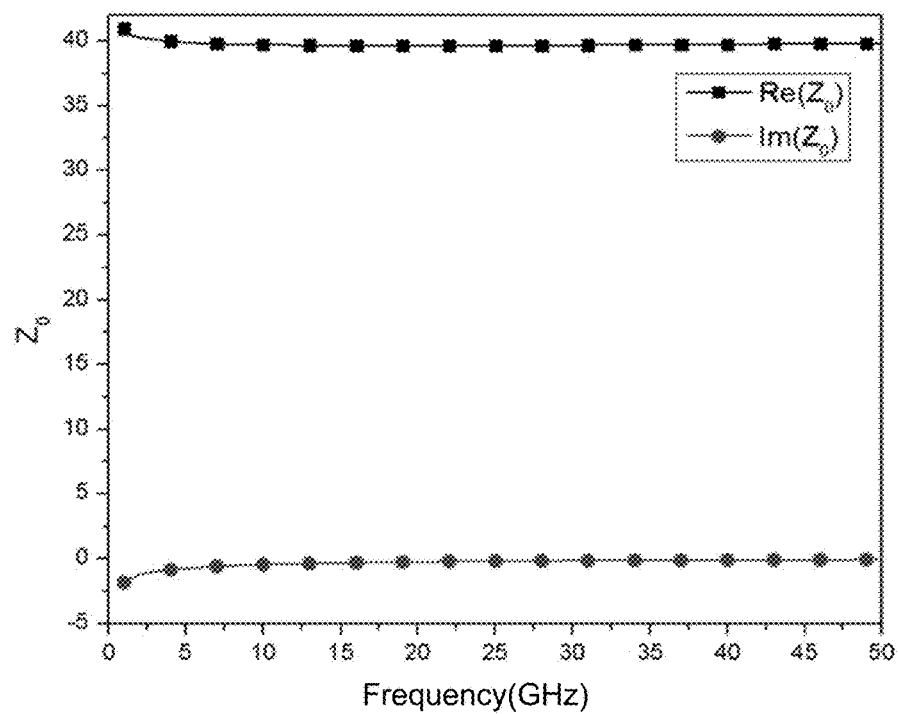
Figure 6C:
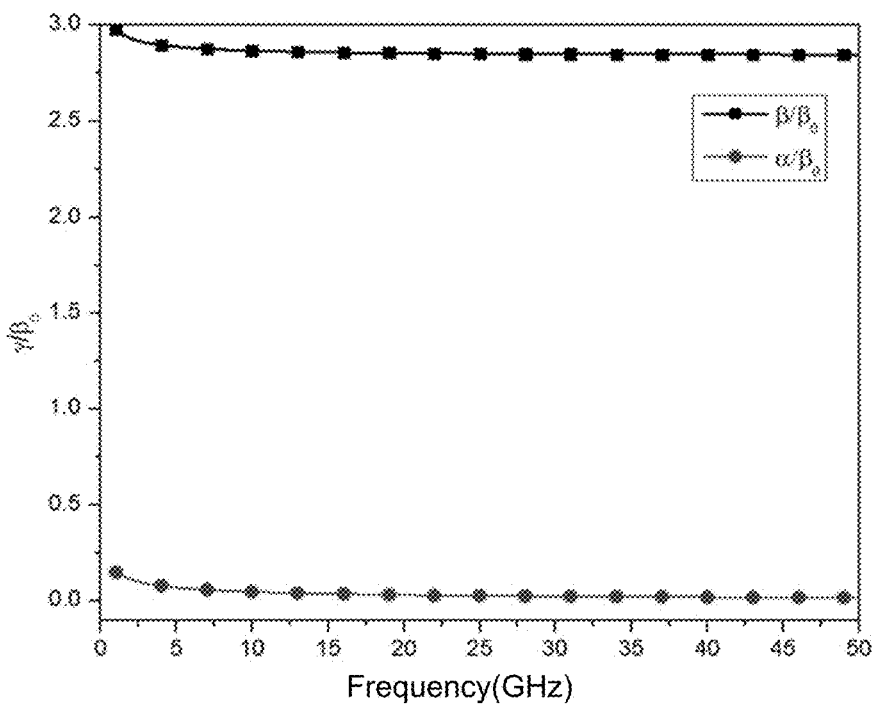
Figure 6D:
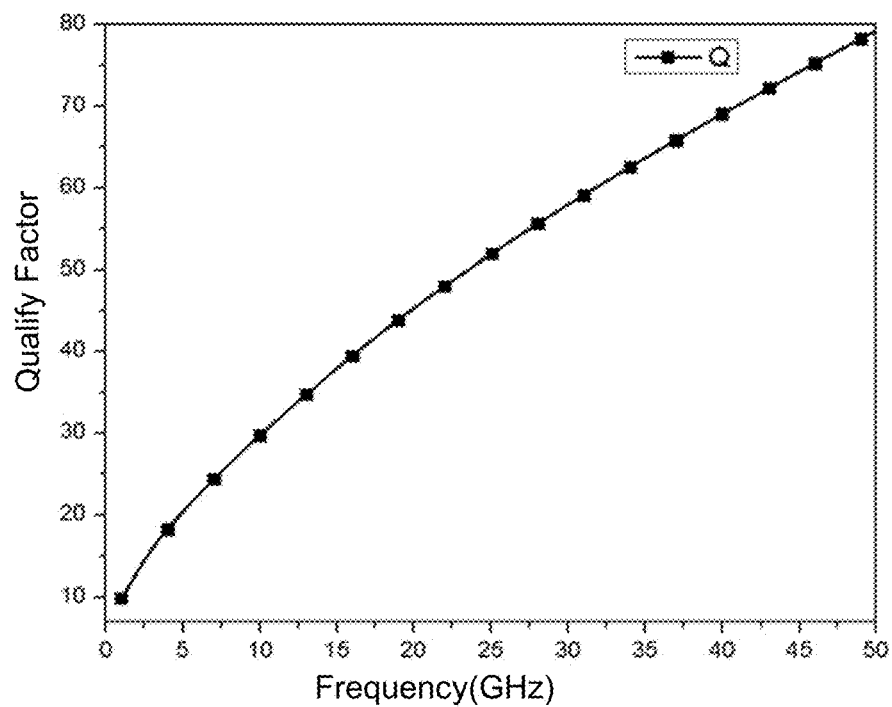
Figure 6E:
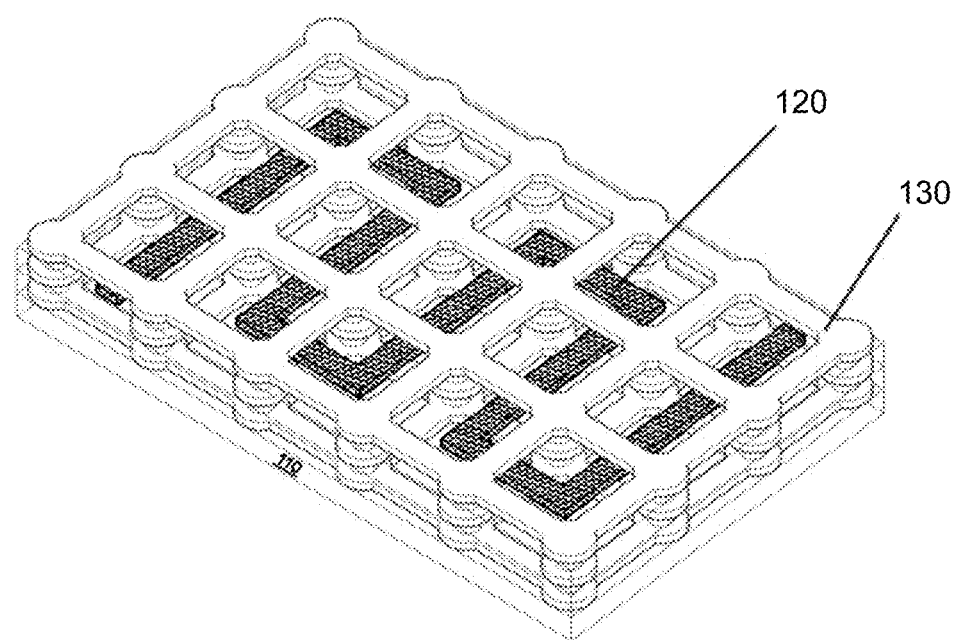
Figure 6F:
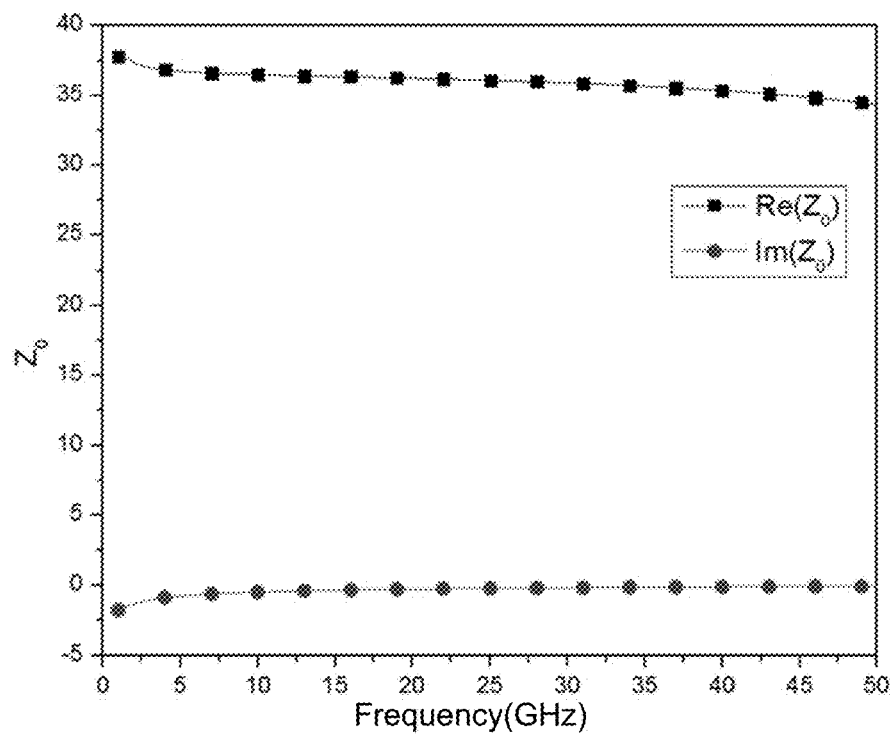
Figure 6G:
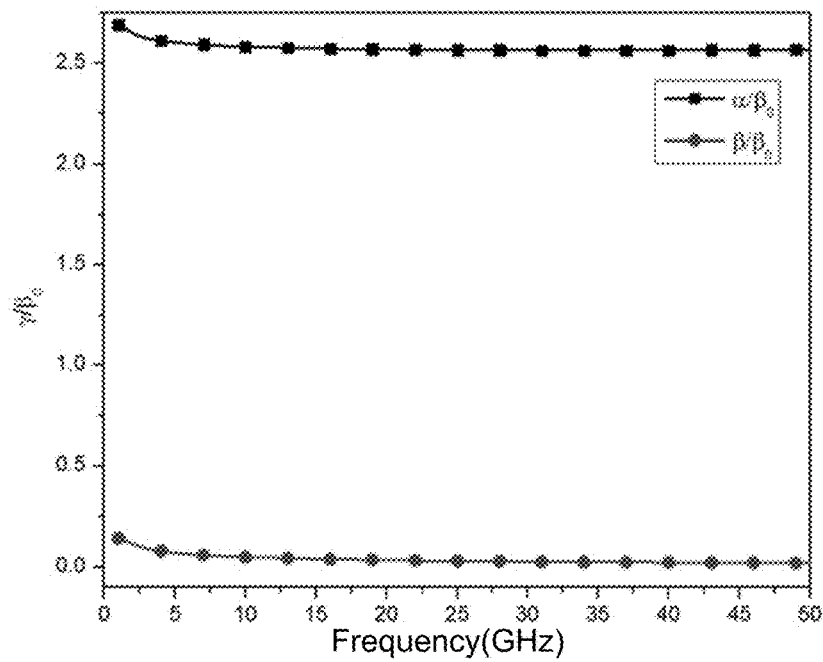
Figure 6H:
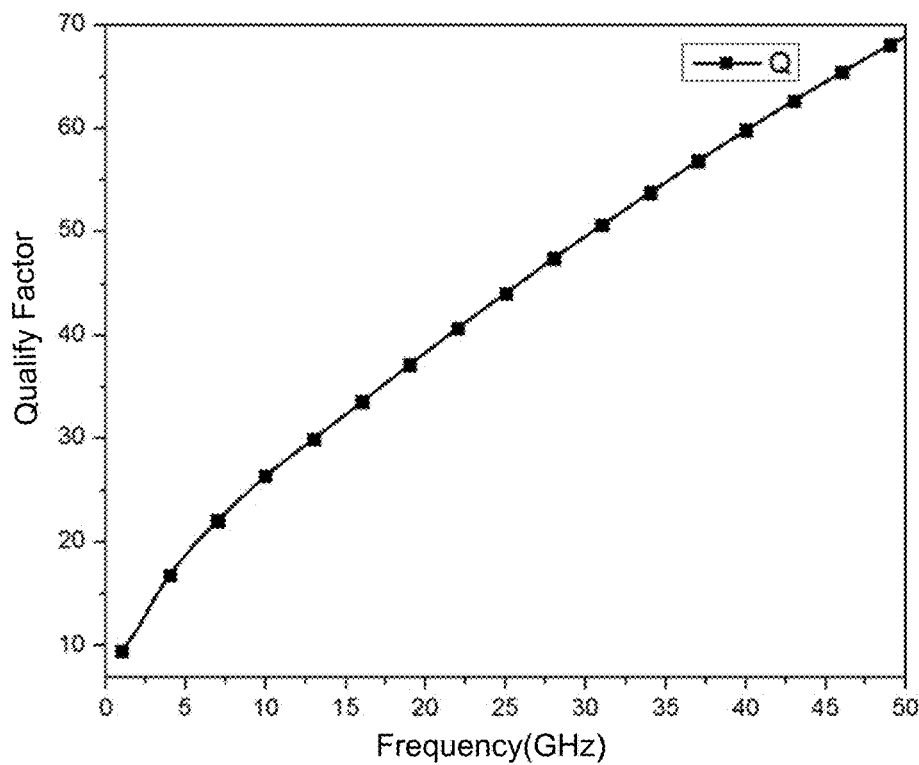

For example, FIG. 6A briefly illustrates the signal transmission line situation and FIG. 6B to FIG. 6D presents the corresponding simulation result of the relation between the transmitted signal frequency and the characteristic impedance, the show wave factor and the quality factor in the situation respectively, FIG. 6E briefly illustrates the single meander line situation and FIG. 6F to FIG. 6H presents the corresponding simulation result of the relation between the transmitted signal frequency and the characteristic impedance, the show wave factor and the quality factor in the situation respectively. Significantly, the real part (Re(Zc)) and the image part (Im(Zc)) of the characteristic impedance, the attenuation constant and the phase constant are essentially not changed with the frequency varies, especially when the frequency is higher than 10~15 GHz. In other words, the simulation result indicates that this invention may let the relation between the frequency of the transmitted signal and the characteristic impedance, the slow wave constant and the qualify constant of each unit cell approach the ideal situation.

Figure 6I:
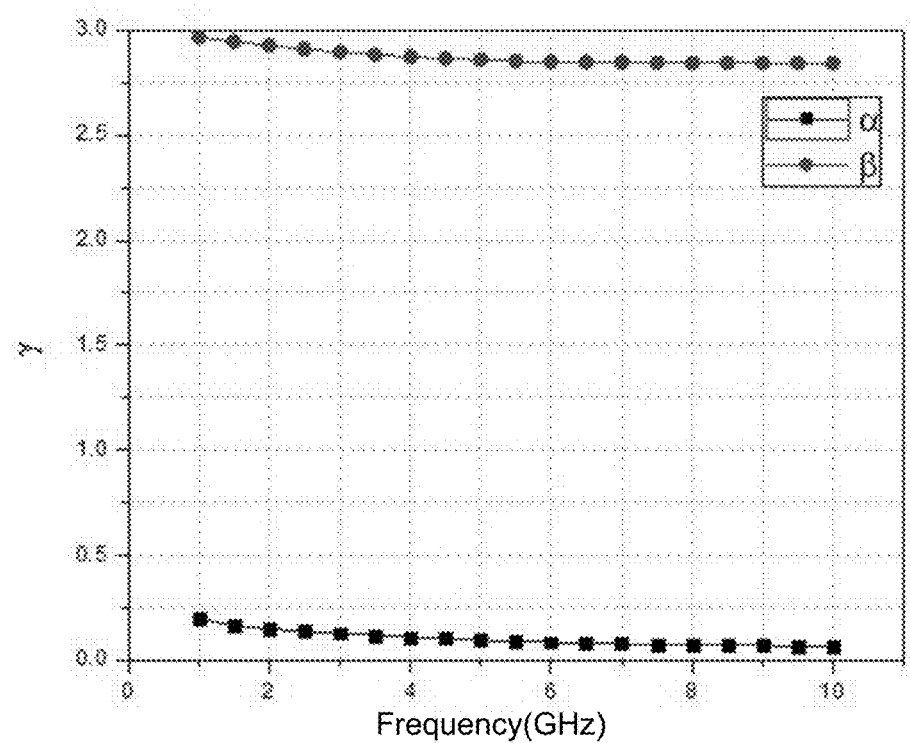
Figure 6J:
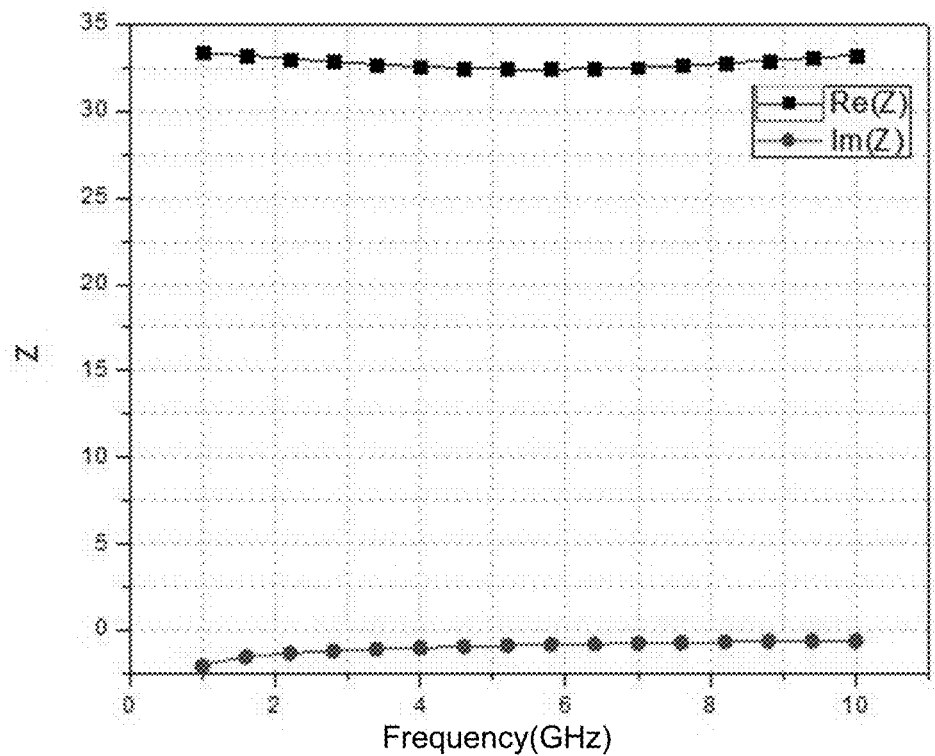
Figure 6K:
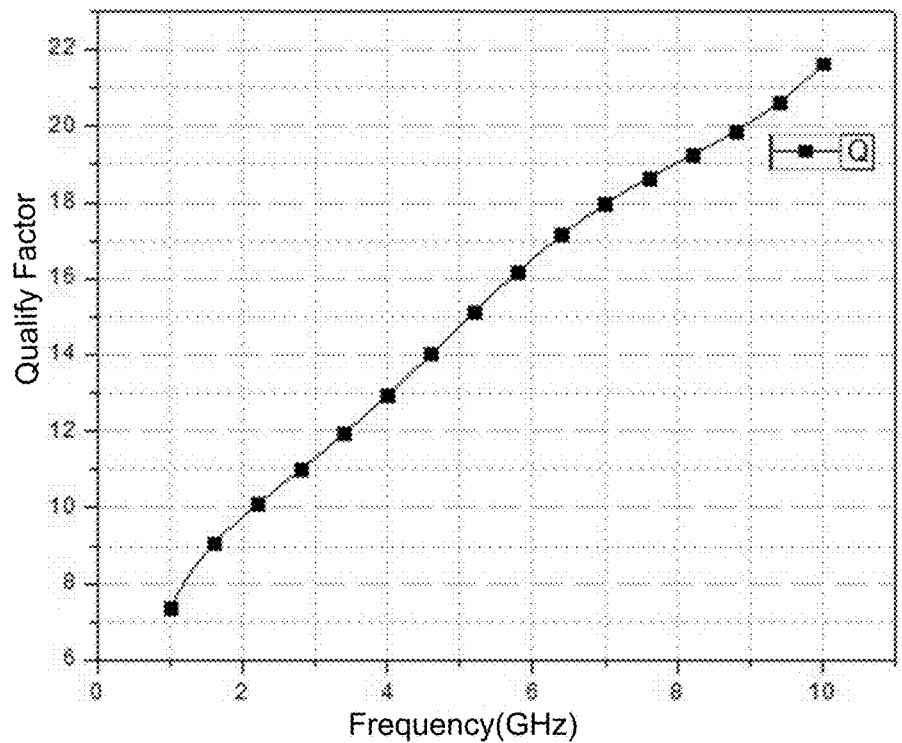
Figure 6L:
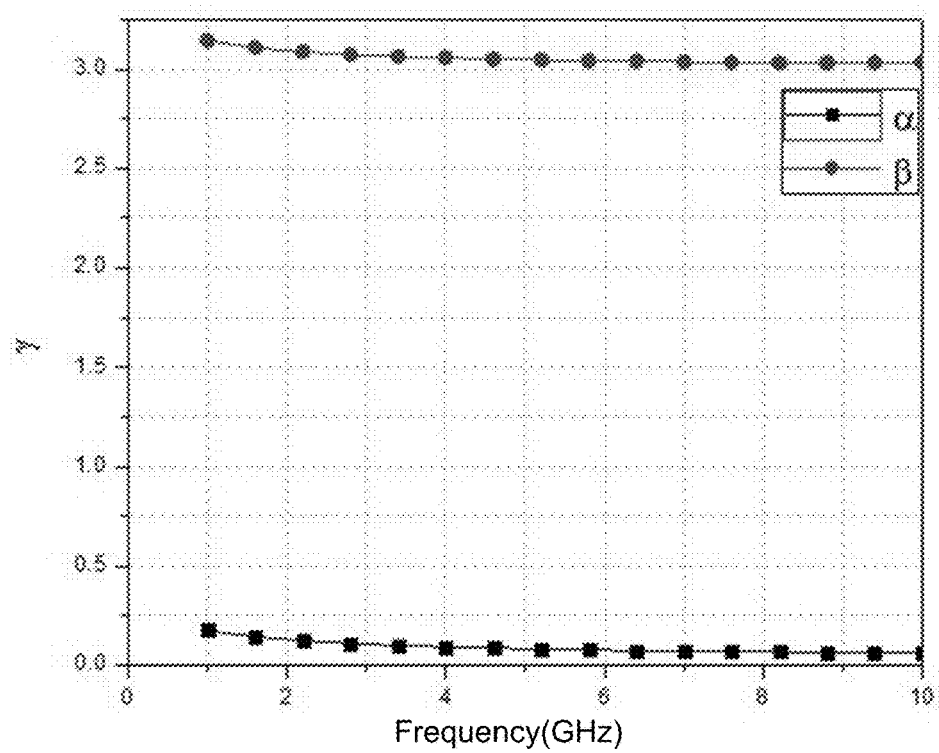
Figure 6M:
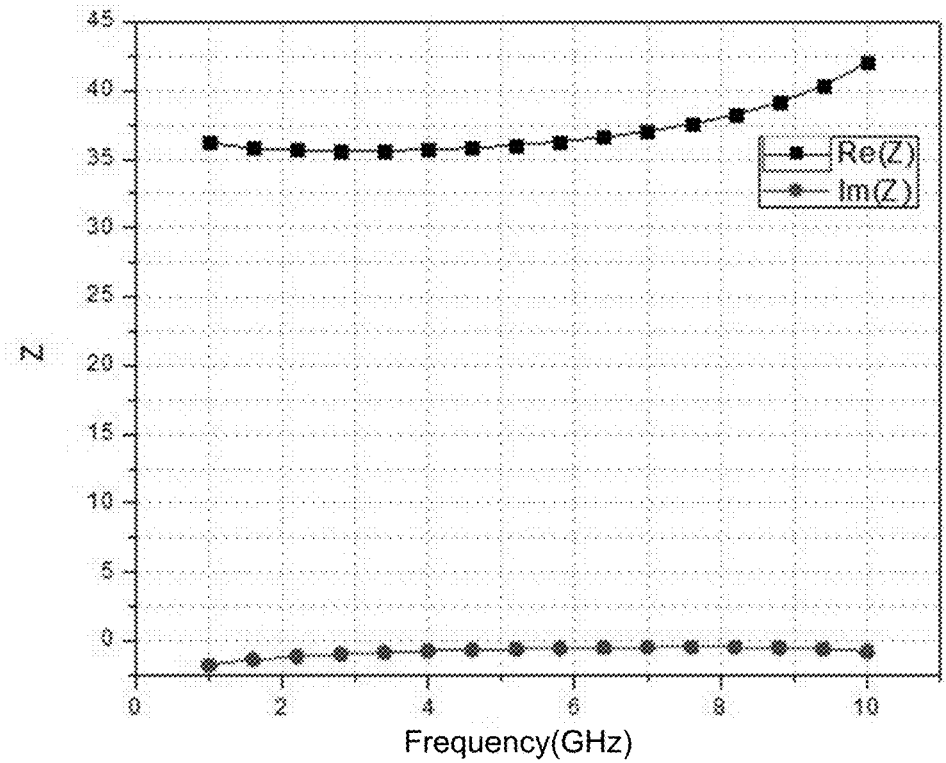
Figure 6N:
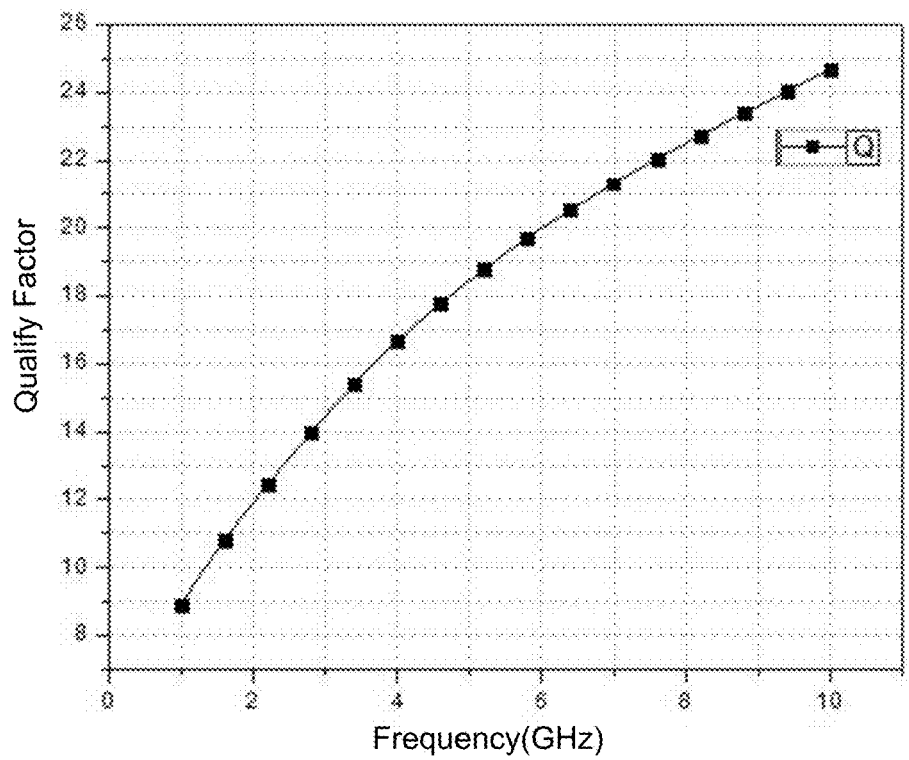
Figure 6O:
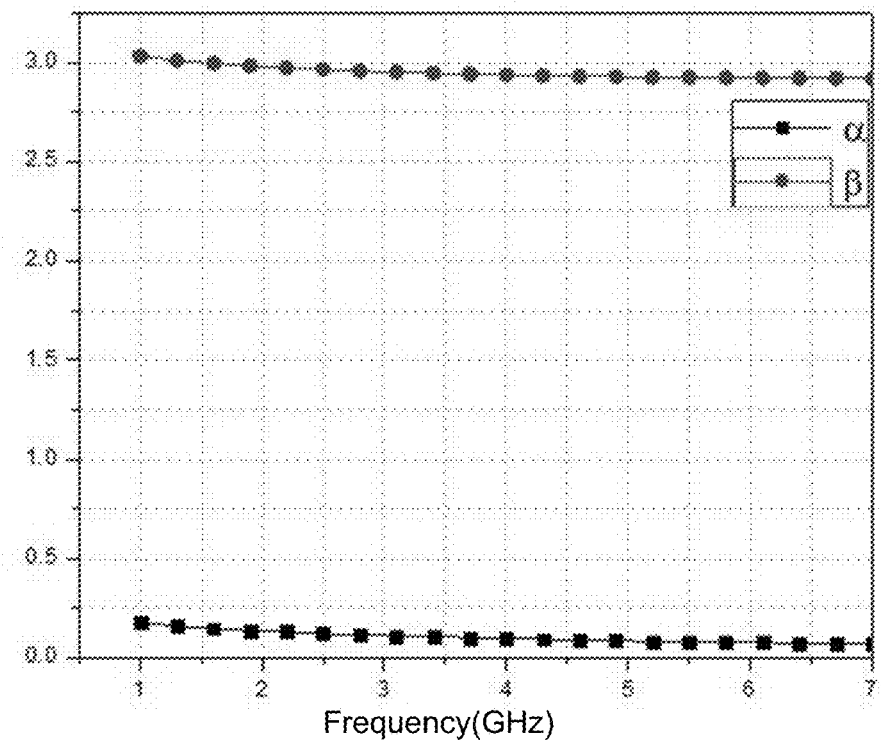
Figure 6P:
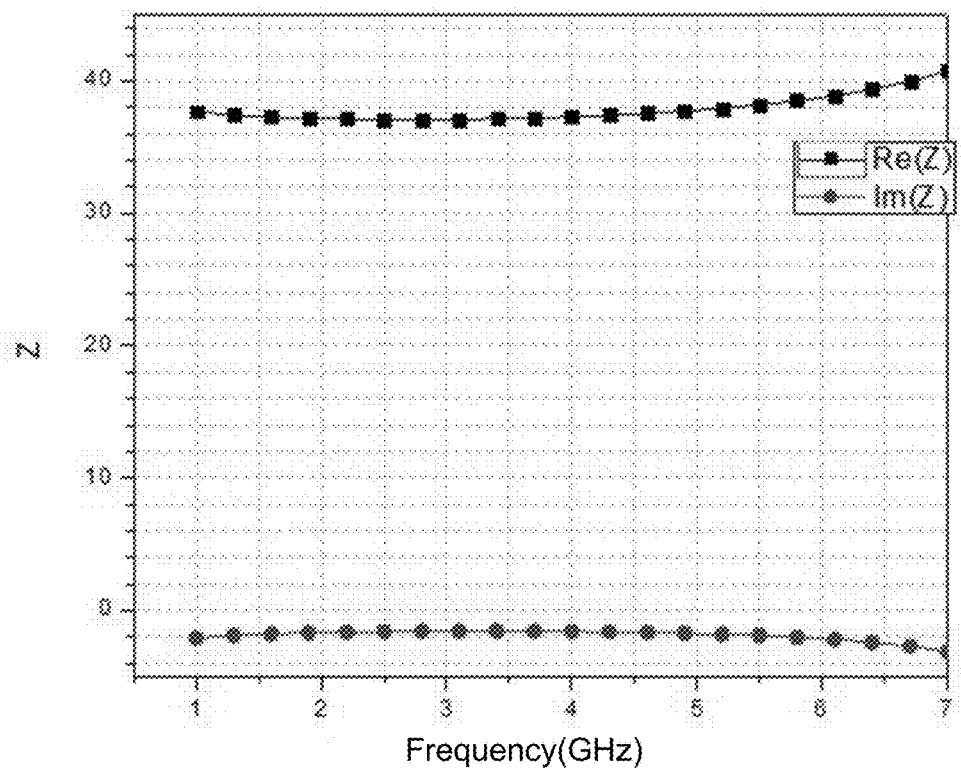
Figure 6Q:
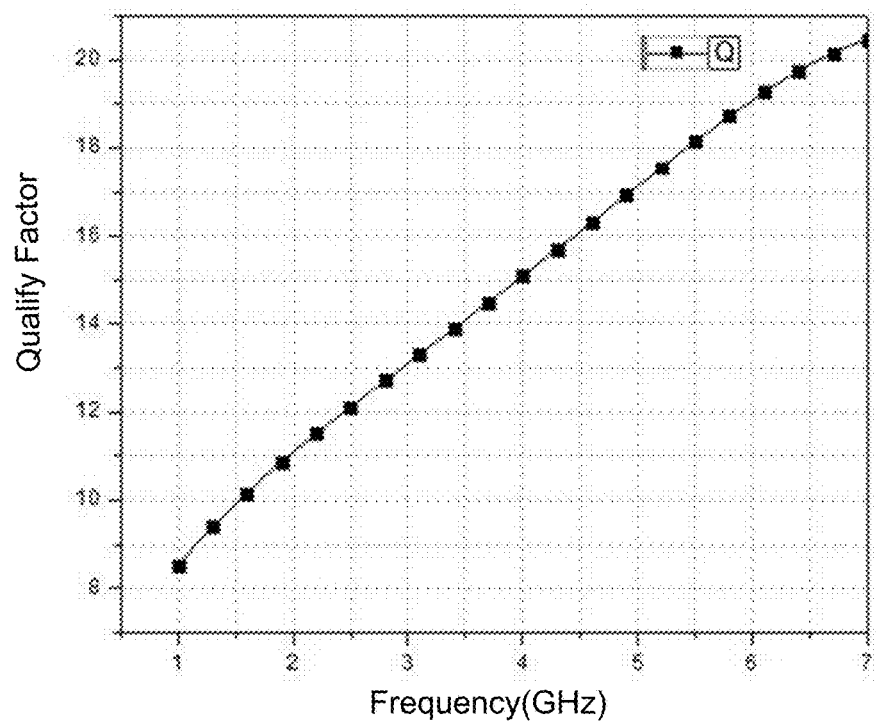

For example, on the frequency range from 1 GHz to 10 GHz, FIG. 6I to FIG. 6K presents the corresponding simulation result of the relation between the transmitted signal frequency and the characteristic impedance, the show wave factor and the quality factor in the application shown in FIG. 3A to FIG. 3D respectively, FIG. 6L to FIG. 6N presents the corresponding simulation result of the relation between the transmitted signal frequency and the characteristic impedance, the show wave factor and the quality factor in the application shown in FIG. 3E to FIG. 3H respectively, and FIG. 6O to FIG. 6Q presents the corresponding simulation result of the relation between the transmitted signal frequency and the characteristic impedance, the show wave factor and the quality factor in the application shown in FIG. 3A to FIG. 3D respectively. Significantly, no matter which three-dimensional trace style, the simulation indicates that the characteristic impedance, the slow wave constant and the qualify constant are all essentially not changed with the frequency varies, especially not sudden fluctuation but at most gradual increments or gradual decrements in response the frequency increment or frequency decrement around the high frequency limitation or the low frequency limitation. In other words, the simulation result indicates that this invention may let the relation between the frequency of the transmitted signal and the characteristic impedance, the slow wave constant and the qualify constant of each unit cell approach the ideal situation.

The presently disclosed embodiments should be considered in all respects to be illustrative and not restrictive. The scope of the invention is indicated by the appended claims rather than the foregoing description, and all variation which come within the meaning and range of equivalents thereof are intended to be embraced therein.

What is claimed is:

1. A three-dimensional complementary-conducting-strip structure, comprising:
    a plurality of two-dimensional mesh metal layers which are stacked mutually along a direction vertically to a surface of a substrate;
    a plurality of two-dimensional mesh vias which connect these two-dimensional mesh metal layers along the direction vertical to the surface of the substrate;
    a plurality of signal line metal layers which stacked mutually along a direction vertically to the surface of the substrate, wherein these signal line metal layers and these two-dimensional mesh metal layers are alternatively stacked; and
    a plurality of signal line vias which connect these signal line metal layers along the direction vertically to the surface of the surface;
    wherein each two-dimensional mesh metal layer is a planar metal layer with one or more empty areas, and wherein these two-dimensional mesh metal layers and these two-dimensional mesh vias form a three-dimensional network structure collectively;
    wherein each signal line metal layer is one or more metal lines parallel to the surface of the substrate;
    wherein each signal line is separated away other signal lines, and wherein each signal line traces three-dimensionally inside the three dimensional network structure.

2. The three-dimensional complementary-conducting-strip structure as claimed in claim 1, wherein the three-dimensional network structure is a three-dimensional arrangement of a plurality of unit cells, wherein each unit cell has two neighboring two-dimensional mesh metal layers positioned on two opposite sides of the unit cell along a Z-direction vertical to the surface of the substrate and has two neighboring two-dimensional mesh vias positioned on two opposite sides of the unit cell along an X-direction or a Y-direction parallel to the surface of the substrate.

3. The three-dimensional complementary-conducting-strip structure as claimed in claim 2, wherein any unit cell comprises at least one of the following adjustable parameters: X-dimensional signal line size (Sx), Y-dimensional signal line size (Sy), Z-dimensional signal line size (Sz), X-dimensional unit cell period (Px), Y-dimensional unit cell period (Py), Z-dimensional unit cell period (Pz), X-dimensional mesh size (Whx), Y-dimensional mesh size (Why) and Z-dimensional mesh size (Whz).

4. The three-dimensional complementary-conducting-strip structure as claimed in claim 2, wherein each unit cell has one or more signal lines positioned inside.

5. The three-dimensional complementary-conducting-strip structure as claimed in claim 2, wherein trace styles of these signal lines inside each unit cell have one or more of the following: single line along the horizontal direction, meander line along the horizontal direction, single line along the vertical direction and meander line along the vertical direction.

6. The three-dimensional complementary-conducting-strip structure as claimed in claim 2, wherein trace styles of these signal lines inside each unit cell have one or more of the following: two parallel segments along the horizontal direction, two parallel segments along the vertical direction, coupled lines structure along the horizontal direction, coupled lines structure along the vertical direction, two signal lines shuttle alongside along the horizontal direction, two signal lines shuttle alongside along the vertical direction, and three or more signal lines pass through respectively.

7. The three-dimensional complementary-conducting-strip structure as claimed in claim 2, wherein shape of these signal lines inside each unit cell comprises at least one of the following: straight line shape, L-like shape, T-like shape, cross shape, five straight lines connected to each other, and six straight lines connected to each other.

8. The three-dimensional complementary-conducting-strip structure as claimed in claim 1, wherein these signal lines pass through these empty areas along the direction vertically to the surface of the substrate, and wherein these signal lines pass through gaps between these two-dimensional mesh vias along the direction parallel to the surface of the substrate.

9. The three-dimensional complementary-conducting-strip structure as claimed in claim 1, further comprising a plurality of inter-metal dielectric layers, wherein each inter-metal dielectric layer is positioned between a two-dimensional mesh metal layer and a neighboring signal line metal layer.

10. The three-dimensional complementary-conducting-strip structure as claimed in claim 1, further comprising at least one of the following:
    the downmost one of these two-dimensional mesh metal layers directly contacts with the substrate; and
    the downmost one of these signal line metal layers directly contacts with the substrate.

11. The three-dimensional complementary-conducting-strip structure as claimed in claim 1, further comprising at least one of the following:
    the three-dimensional network structure is grounded; and these signal lines are electrically connected to a plurality of elements and/or terminals positioned in and/or on the substrate respectively.

12. A three-dimensional complementary-conducting-strip structure, comprising:
- a three-dimensional network structure which has a plurality of unit cells; and
- one or more signal lines which traces three-dimensionally inside the three-dimensional network structure;
- wherein these unit cells are three-dimensionally arranged on a substrate;
- wherein each unit cell has at least one empty area;
- wherein these signal lines traces three-dimensionally through these empty areas inside the three-dimensional network unit cell;
- wherein each unit cell has one or more signal lines;
- wherein each signal line is separated away the three-dimensional network structure and other signal lines;
- wherein the three-dimensional network structure has two or more two-dimensional mesh metal layers vertically stacked mutually, wherein each two-dimensional mesh metal layer is a planar metal layer with one or more empty area, and wherein these two-dimensional mesh metal layers are mutually connected by a plurality of two-dimensional mesh vias;
- wherein each unit cell has two neighboring two-dimensional mesh metal layers positioned on two sides of the unit cell along a Z-direction vertical to the surface of the substrate and has two neighboring two-dimensional mesh vias positioned on two sides of the unit cell along an X-direction or a Y-direction parallel to the surface of the substrate respectively.

13. The three-dimensional complementary-conducting-strip structure as claimed in claim 12, wherein any unit cell has at least one of the following adjustable parameters: X-dimensional signal line size (Sx), Y-dimensional signal line size (Sy), Z-dimensional signal line size (Sz), X-dimensional unit cell period (Px), Y-dimensional unit cell period (Py), Z-dimensional unit cell period (Pz), X-dimensional mesh size (Whx), Y-dimensional mesh size (Why) and Z-dimensional mesh size (Whz).

14. The three-dimensional complementary-conducting-strip structure as claimed in claim 12, wherein trace styles of these signal lines inside each unit cell have one or more of the following: single line along the horizontal direction, meander line along the horizontal direction, single line along the vertical direction and meander line along the vertical direction.

15. The three-dimensional complementary-conducting-strip structure as claimed in claim 12, wherein trace styles of these signal lines inside each unit cell have one or more of the following: two parallel segments along the horizontal direction, two parallel segments along the vertical direction, coupled lines structure along the horizontal direction, coupled lines structure along the vertical direction, two signal lines shuttle alongside along the horizontal direction, two signal lines shuttle alongside along the vertical direction, and three or more signal lines pass through respectively.

16. The three-dimensional complementary-conducting-strip structure as claimed in claim 12, wherein shape of these signal lines inside each unit cell comprises at least one of the following: straight line shape, L-like shape, T-like shape, cross shape, five straight lines connected to each other, and six straight lines connected to each other.

17. The three-dimensional complementary-conducting-strip structure as claimed in claim 12, further comprising at least one of the following:
- all signal lines positioned inside any unit cell is separated from all edges of the unit cell; and
- dielectric material surrounding the three-dimensional network structure electrically separates the three-dimensional network structure away each of the signal lines.

18. The three-dimensional complementary-conducting-strip structure as claimed in claim 12, further comprising at least one of the following:
- the three-dimensional network structure is grounded; and
- these signal lines are electrically connected to a plurality of elements and/or terminals positioned in and/or on the substrate respectively.

* * * * *